US012169362B2

(12) United States Patent
Kamimura et al.

(10) Patent No.: US 12,169,362 B2
(45) Date of Patent: *Dec. 17, 2024

(54) CHEMICAL LIQUID, CHEMICAL LIQUID STORAGE BODY, CHEMICAL LIQUID FILLING METHOD, AND CHEMICAL LIQUID STORAGE METHOD

(71) Applicant: FUJIFILM Corporation, Tokyo (JP)

(72) Inventors: Tetsuya Kamimura, Haibara-gun (JP); Satomi Takahashi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/218,727

(22) Filed: Jul. 6, 2023

(65) Prior Publication Data

US 2023/0350306 A1    Nov. 2, 2023

Related U.S. Application Data

(60) Division of application No. 17/740,438, filed on May 10, 2022, now Pat. No. 11,740,557, which is a
(Continued)

(30) Foreign Application Priority Data

Sep. 27, 2016   (JP) ................. 2016-188273

(51) Int. Cl.
*C11D 3/16* (2006.01)
*B65D 88/06* (2006.01)
(Continued)

(52) U.S. Cl.
CPC ............ *G03F 7/325* (2013.01); *B65D 88/06* (2013.01); *B65D 88/08* (2013.01); *C08F 10/06* (2013.01);
(Continued)

(58) Field of Classification Search
CPC .... C11D 3/16; C11D 3/20; C11D 3/43; C11D 7/22; C11D 7/26; C11D 7/50; C08F 10/06; C08F 14/26; B65D 88/06; B65D 88/08
See application file for complete search history.

(56) References Cited

U.S. PATENT DOCUMENTS 5,296,009 A    3/1994  Duke
6,610,638 B1   8/2003  Tanigawa et al.
(Continued)

FOREIGN PATENT DOCUMENTS

JP        4030262 B2      1/2008
JP        2009-25708 A    2/2009
(Continued)

OTHER PUBLICATIONS

International Search Report dated Dec. 5, 2017 from the International Searching Authority in counterpart International Application No. PCT/JP2017/030885.
(Continued)

*Primary Examiner* — Brian P Mruk
(74) *Attorney, Agent, or Firm* — Sughrue Mion, PLLC

(57) ABSTRACT

An object of the present invention is to provide a chemical liquid having excellent developability and excellent defect inhibition performance. Another object of the present invention is to provide a chemical liquid storage body, a chemical liquid filling method, and a chemical liquid storage method. The chemical liquid according to an embodiment of the present invention is a chemical liquid containing an organic solvent, a metal impurity, and an organic impurity, in which the metal impurity contains metal atoms, a total content of the metal atoms in the chemical liquid with respect to a total mass of the chemical liquid is equal to or smaller than 50 mass ppt, a total content of the organic impurity in the chemical liquid with respect to the total mass of the chemical (Continued)

liquid is 0.1 to 10,000 mass ppm, the organic impurity contains an alcohol impurity, and a mass ratio of a content of the alcohol impurity to the total content of the organic impurity is 0.0001 to 0.5.

9 Claims, 2 Drawing Sheets

Related U.S. Application Data division of application No. 16/365,016, filed on Mar. 26, 2019, now Pat. No. 11,360,389, which is a continuation of application No. PCT/JP2017/030885, filed on Aug. 29, 2017.

(51) Int. Cl.
| | |
|---|---|
| B65D 88/08 | (2006.01) |
| C08F 10/06 | (2006.01) |
| C08F 14/26 | (2006.01) |
| C11D 3/20 | (2006.01) |
| C11D 3/43 | (2006.01) |
| C11D 7/22 | (2006.01) |
| C11D 7/26 | (2006.01) |
| C11D 7/50 | (2006.01) |
| G03F 7/16 | (2006.01) |
| G03F 7/32 | (2006.01) |
| H01L 21/027 | (2006.01) |

(52) U.S. Cl.
CPC .............. *C08F 14/26* (2013.01); *G03F 7/16* (2013.01); *H01L 21/0274* (2013.01)

(56) References Cited

U.S. PATENT DOCUMENTS

| | | | | |
|---|---|---|---|---|
| 10,884,338 | B2* | 1/2021 | Kamimura | .......... G03F 7/70991 |
| 11,079,677 | B2* | 8/2021 | Kamimura | .............. G03F 7/325 |
| 11,360,389 | B2* | 6/2022 | Kamimura | ................ G03F 7/16 |
| 11,740,557 | B2* | 8/2023 | Kamimura | ............. B65D 88/06 |
| | | | | 510/175 |
| 11,747,727 | B2* | 9/2023 | Kamimura | ............ G03F 7/2002 |
| | | | | 430/324 |
| 2002/0015676 | A1 | 2/2002 | Tanaka et al. | |
| 2003/0024883 | A1* | 2/2003 | Mullee | ...................... B01J 47/00 |
| | | | | 210/661 |
| 2015/0227049 | A1 | 8/2015 | Yamanaka et al. | |
| 2016/0070167 | A1 | 3/2016 | Katoka et al. | |
| 2017/0285482 | A1 | 10/2017 | Tsuchihashi et al. | |
| 2019/0219923 | A1 | 7/2019 | Kamimura et al. | |
| 2022/0276561 | A1 | 9/2022 | Kamimura et al. | |

FOREIGN PATENT DOCUMENTS

| | | |
|---|---|---|
| JP | 4570786 B2 | 10/2010 |
| JP | 2014-112176 A | 9/2014 |
| JP | 2014-194534 A | 10/2014 |
| JP | 2015-7807 A | 1/2015 |
| JP | 2016-73922 A | 5/2016 |
| TW | 201423289 A | 6/2014 |
| TW | 201627780 A | 8/2016 |
| WO | 00/58252 A1 | 10/2000 |
| WO | 2018/061573 A1 | 4/2018 |

OTHER PUBLICATIONS

Notification of Reason for Refusal dated Sep. 18, 2020 from the Korean Intellectual Property Office in Application No. 10-2019-7008503.
International Preliminary Report on Patentability dated Apr. 2, 2019 from the International Bureau in counterpart with International Application No. PCT/JP2017/030885.
Notice of Reasons for Refusal dated Jan. 28, 2020, issued by the Japanese Patent Office in JP Application No. 2018-542011.
"High-purity solvent Primepure-series", Kojundo Yobai Primepure Series, Kanto Chemical Co., Inc., Jan. 2016, 6 pages.
Second Office Action dated Mar. 31, 2021 from the Taiwanese Patent Office in TW Application No. 106130405.
Notice of Reasons for Refusal dated Oct. 5, 2021 from the Japanese Patent Office in Japanese Application No. 2020-190732.
Communication dated Jan. 4, 2021 from the Taiwanese Patent Office in TW Application No. 106130405.

* cited by examiner

US 12,169,362 B2

CHEMICAL LIQUID, CHEMICAL LIQUID STORAGE BODY, CHEMICAL LIQUID FILLING METHOD, AND CHEMICAL LIQUID STORAGE METHOD

CROSS-REFERENCE TO RELATED APPLICATIONS

This application is a divisional of application Ser. No. 17/740,438 filed May 10, 2022, now issued as U.S. Pat. No. 11,740,557 on Aug. 29, 2023, which is a divisional of application Ser. No. 16/365,016 filed Mar. 26, 2019, now issued as U.S. Pat. No. 11,360,389 on Jun. 14, 2022, which is a Continuation of PCT International Application No. PCT/JP2017/030885 filed on Aug. 29, 2017, which claims priority under 35 U.S.C. § 119(a) to Japanese Patent Application No. 2016-188273 filed on Sep. 27, 2016. The above applications are hereby expressly incorporated by reference, in their entirety, into the present application.

BACKGROUND OF THE INVENTION

1. Field of the Invention

The present invention relates to a chemical liquid, a chemical liquid storage body, a chemical liquid filling method, and a chemical liquid storage method.

2. Description of the Related Art

Conventionally, in a process of manufacturing a semiconductor device such as an Integrated Circuit (IC) or a Large Scale Integrated circuit (LSI), microfabrication is performed by a photolithography process by using a photoresist composition.

In the photolithography process, a coating film is formed of a photoresist composition (an actinic ray-sensitive or radiation-sensitive resin composition which is also called chemical amplification-type resist composition), the obtained coating film is then exposed and then developed using a developer so as to obtain a pattern-like cured film, and the developed cured film is washed with a rinse solution. In addition, in order to improve the wettability of the photoresist composition with respect to a substrate, before the substrate is coated with the photoresist composition, a prewet solution is brought into contact with the surface of the substrate.

It is apprehended that in the aforementioned semiconductor device manufacturing process, the mixing of particles having a size of several micrometers may cause a defect failure in the semiconductor device. Therefore, raw materials, solvents, or the like used in the semiconductor device manufacturing process are required to have high purity.

JP2015-007807A describes "an organic treatment solution for patterning a chemical amplification-type resist film, containing an alkylolefin having 22 or less carbon atoms in an amount equal to or smaller than 1 ppm, in which the concentration of all the metal elements of Na, K, Ca, Fe, Cu, Mg, Mn, Li, Al, Cr, Ni, and Zn is equal to or lower than 5 ppm, the organic treatment solution is an organic developer, and the total moisture content in the developer is less than 10% by mass".

SUMMARY OF THE INVENTION

In recent years, the chemical liquid used in the photolithography process has been required to exhibit further improved developability and defect inhibition performance in a case where the chemical liquid is used, for example, as a developer, a prewet solution, and the like. Meanwhile, the inventors of the present invention examined the organic treatment solution for patterning a chemical amplification-type resist film described in JP2015-007807A. As a result, the inventors have found that the developability and the defect inhibition performance need to be further improved.

An object of the present invention is to provide a chemical liquid which exhibits excellent developability and excellent defect inhibition performance in a case where the chemical liquid is used as a prewet solution, a developer, and the like. Another object of the present invention is to provide a chemical liquid storage body, a chemical liquid filling method, and a chemical liquid storage method.

In the present specification, the developability and the defect inhibition performance mean the physical properties of a chemical liquid that can be measured by the method described in Examples.

In order to achieve the aforementioned objects, the inventors of the present invention carried out an intensive examination. As a result, the inventors have found that the objects can be achieved by the following constitution.

[1] A chemical liquid comprising an organic solvent, a metal impurity, and an organic impurity, in which the metal impurity contains metal atoms, a total content of the metal atoms in the chemical liquid with respect to a total mass of the chemical liquid is equal to or smaller than 50 mass ppt, a total content of the organic impurity in the chemical liquid with respect to the total mass of the chemical liquid is 0.1 to 10,000 mass ppm, the organic impurity contains an alcohol impurity, and a mass ratio of a content of the alcohol impurity to the total content of the organic impurity is 0.0001 to 0.5.

[2] The chemical liquid described in [1], in which the metal impurity contains a Fe atom, a Ni atom, a Cr atom, and a Pb atom, a mass ratio of a content of the Fe atom to the total content of the metal atoms is 0.01 to 0.5, a mass ratio of a content of the Cr atom to the total content of the metal atoms is 0.01 to 0.5, a mass ratio of a content of the Ni atom to the total content of the metal atoms is 0.01 to 0.5, and a mass ratio of a content of the Pb atom to the total content of the metal atoms is 0.005 to 0.3.

[3] The chemical liquid described in [1] or [2], in which a mass ratio of a total content of a component having a boiling point equal to or higher than 250° C. to a total content of a component having a boiling point lower than 250° C. in the chemical liquid is 0.00001 to 0.001.

[4] The chemical liquid described in any one of [1] to [3], in which a content of water in the chemical liquid with respect to the total mass of the chemical liquid is 0.1% to 1.5% by mass.

[5] The chemical liquid described in any one of [1] to [4], in which the number of objects to be counted having a size equal to or greater than 0.1 μm that are counted by a light scattering-type liquid-borne particle counter is equal to or smaller than 100/mL.

[6] The chemical liquid described in any one of [1] to [5], in which the organic solvent has a boiling point lower than 200° C.

[7] The chemical liquid described in any one of [1] to [6], in which the organic solvent contains at least one kind of compound selected from the group consisting of propylene glycol monomethyl ether, propylene glycol monoethyl ether, propylene glycol monopropyl ether, propylene glycol monomethyl ether acetate, ethyl lactate, methyl methoxypropionate, hexyl alcohol, 2-heptanone, isoamyl acetate, cyclopentanone, cyclohexanone, γ-butyrolactone, diisoamyl ether, butyl acetate, 2-hydroxymethyl butyrate, cyclohexanone dimethyl acetal, and 4-methyl-2-pentanol.

[8] A chemical liquid storage body comprising a storage tank and the chemical liquid described in any one of [1] to [7] that is stored in the storage tank, in which a liquid contact portion contacting the chemical liquid in the storage tank is formed of a nonmetallic material or electropolished stainless steel.

[9] The chemical liquid storage body, in which the nonmetallic material is at least one kind of material selected from the group consisting of a polyethylene resin, a polypropylene resin, a polyethylene-polypropylene resin, polytetrafluoroethylene, a tetrafluoroethylene-perfluoroalkyl vinyl ether copolymer, a tetrafluoroethylene-hexafluoropropylene copolymer resin, a tetrafluoroethylene-ethylene copolymer resin, a chlorotrifluoro ethylene-ethylene copolymer resin, a vinylidene fluoride resin, a chlorotrifluoroethylene copolymer resin, and a vinyl fluoride resin.

[10] A chemical liquid filling method for filling a storage tank with the chemical liquid described in any one of [1] to [7] by transferring the chemical liquid to the storage tank from a tank lorry including a tank storing the chemical liquid, comprising a step of connecting the tank and the storage tank to each other through a first connection member, and a step of filling the storage tank with the chemical liquid in the tank by transferring the chemical liquid to the storage tank through the first connection member.

[11] The chemical liquid filling method described in [10], in which the first connection member is a member satisfying a condition 1 or a condition 2 described below.

Condition 1: under a condition in which a ratio of a mass of the first connection member to a volume of the chemical liquid transferred to and filled into the storage tank becomes 10% provided that a liquid temperature of the chemical liquid is 25° C., in a case where the first connection member is immersed for 1 week in the chemical liquid having a liquid temperature of 25° C., the total content of the metal atoms contained in the metal impurity eluted into the chemical liquid is equal to or smaller than 1.0 mass ppt.

Condition 2: under a condition in which a ratio of a mass of the first connection member to a volume of the chemical liquid transferred to and filled into the storage tank becomes 10% provided that a liquid temperature of the chemical liquid is 25° C., in a case where the first connection member is immersed for 1 week in the chemical liquid having a liquid temperature of 25° C., the total content of the organic impurity eluted into the chemical liquid is equal to or smaller than 1.0 mass ppt.

[12] The chemical liquid filling method described in [10] or [11], in which a liquid contact portion, which contacts the chemical liquid, of at least one kind of constituent selected from the group consisting of the tank, the storage tank, and the first connection member is formed of a nonmetallic material or electropolished stainless steel.

[13] The chemical liquid filling method described in [12], in which the nonmetallic material is at least one kind of material selected from the group consisting of a polyethylene resin, a polypropylene resin, a polyethylene-polypropylene resin, polytetrafluoroethylene, a tetrafluoroethylene-perfluoroalkyl vinyl ether copolymer, a tetrafluoroethylene-hexafluoropropylene copolymer resin, a tetrafluoroethylene-ethylene copolymer resin, a chlorotrifluoro ethylene-ethylene copolymer resin, a vinylidene fluoride resin, a chlorotrifluoroethylene copolymer resin, and a vinyl fluoride resin.

[14] The chemical liquid filling method described in any one of [10] to [13], further comprising a step of transferring the chemical liquid, which has been transferred to and filled into the storage tank, to a supply tank, which is connected to the storage tank through a second connection member, through the second connection member such that the supply tank is filled with the chemical liquid.

[15] The chemical liquid filling method described in [14], in which a liquid contact portion, which contacts the chemical liquid, of at least one kind of constituent selected from the group consisting of the supply tank and the second connection member is formed of a nonmetallic material or electropolished stainless steel.

[16] The chemical liquid filling method described in [15], in which the nonmetallic material is at least one kind of material selected from the group consisting of a polyethylene resin, a polypropylene resin, a polyethylene-polypropylene resin, polytetrafluoroethylene, a tetrafluoroethylene-perfluoroalkyl vinyl ether copolymer, a tetrafluoroethylene-hexafluoropropylene copolymer resin, a tetrafluoroethylene-ethylene copolymer resin, a chlorotrifluoro ethylene-ethylene copolymer resin, a vinylidene fluoride resin, a chlorotrifluoroethylene copolymer resin, and a vinyl fluoride resin.

[17] The chemical liquid filling method described in any one of [14] to [16], further comprising a step of transferring the chemical liquid, which has been transferred to and filled into the supply tank, to a device, which is connected to the supply tank through a third connection member, through the third connection member such that the device is filled with the chemical liquid.

[18] The chemical liquid filling method described in [17], in which a liquid contact portion, which contacts the chemical liquid, of at least one kind of constituent selected from the group consisting of the device and the third connection member is formed of a nonmetallic material or electropolished stainless steel.

[19] The chemical liquid filling method described in [18], in which the nonmetallic material is at least one kind of material selected from the group consisting of a polyethylene resin, a polypropylene resin, a polyethylene-polypropylene resin, polytetrafluoroethylene, a tetrafluoroethylene-perfluoroalkyl vinyl ether copolymer, a tetrafluoroethylene-hexafluoropropylene copolymer resin, a tetrafluoroethylene-ethylene copolymer resin, a chlorotrifluoro ethylene-ethylene copolymer resin, a vinylidene fluoride resin, a chlorotrifluoroethylene copolymer resin, and a vinyl fluoride resin.

[20] The chemical liquid filling method described in any one of [17] to [19], in which the third connection member includes at least one kind of filter.

[21] A chemical liquid storage method for storing the chemical liquid described in any one of [1] to [7] that is stored in the storage tank, comprising an adjustment step of adjusting at least one kind of item selected from the group consisting of a temperature of the chemical liquid, an internal pressure of the storage tank, and a relative humidity of a headspace portion in the storage tank.

[22] The chemical liquid storage method described in [21], in which a liquid contact portion, which contacts the chemical liquid, of the storage tank is formed of a nonmetallic material or electropolished stainless steel.

[23] The chemical liquid storage method described in [22], in which the nonmetallic material is at least one kind of material selected from the group consisting of a polyethylene resin, a polypropylene resin, a polyethylene-polypropylene resin, polytetrafluoroethylene, a tetrafluoroethylene-perfluoroalkyl vinyl ether copolymer, a tetrafluoroethylene-hexafluoropropylene copolymer resin, a tetrafluoroethylene-ethylene copolymer resin, a chlorotrifluoro ethylene-ethylene copolymer resin, a vinylidene fluoride resin, a chlorotrifluoroethylene copolymer resin, and a vinyl fluoride resin.

[24] The chemical liquid storage method described in any one of [21] to [23], in which the adjustment step has a step of adjusting the temperature to be 10° C. to 30° C., a step of adjusting the internal pressure to be 0.1 to 1.0 MPa, and a step of adjusting the relative humidity to be 30% to 90%.

According to the present invention, it is possible to provide a chemical liquid which exhibits excellent developability and excellent defect inhibition performance in a case where the chemical liquid is used as a prewet solution, a developer, and the like. Furthermore, the present invention can also provide a chemical liquid storage body, a chemical liquid filling method, and a chemical liquid storage method.

DESCRIPTION OF THE PREFERRED EMBODIMENTS

Figure 1:
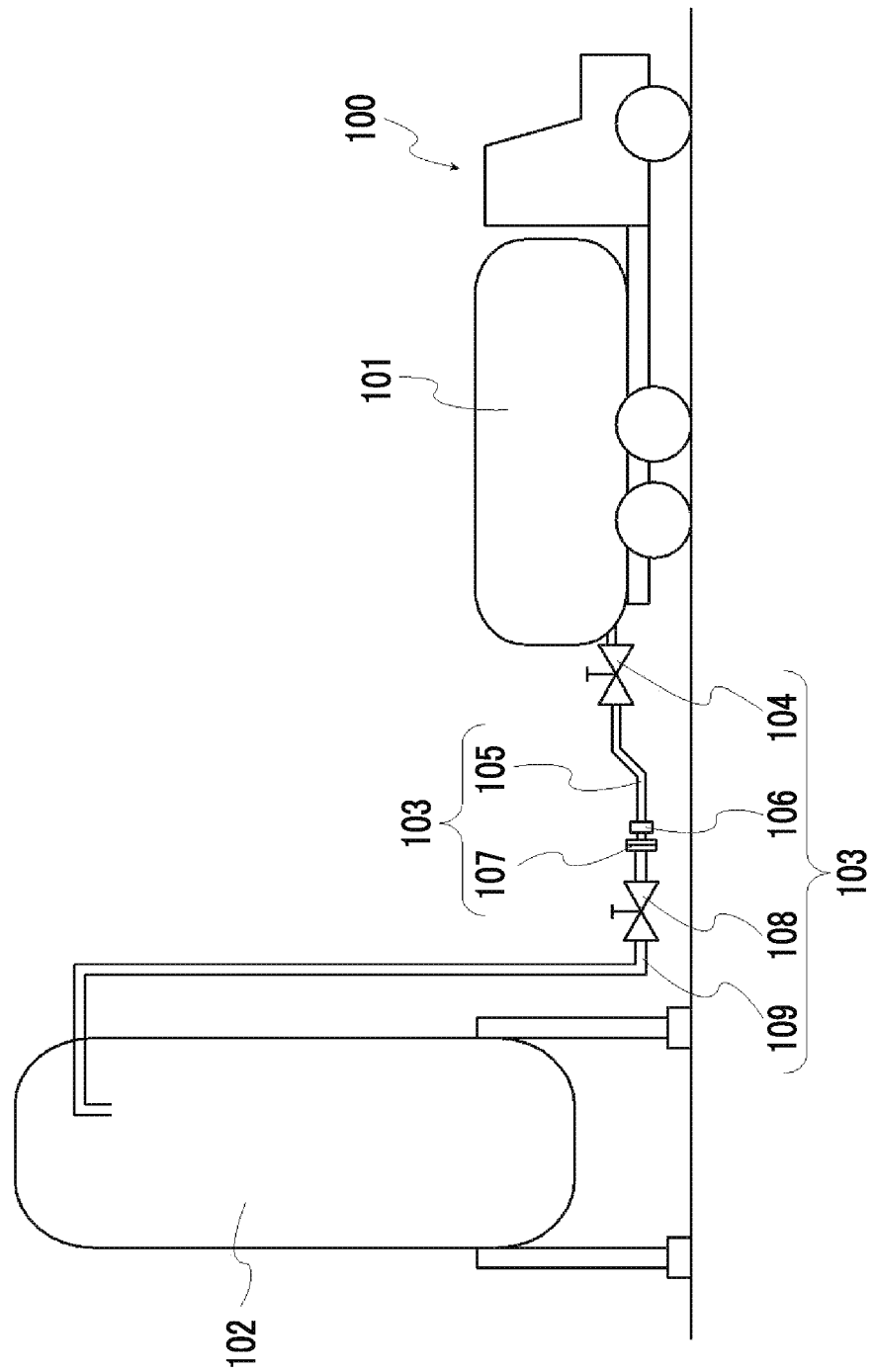
FIG. 1 is a schematic view showing an aspect of a method for filling a storage tank with a chemical liquid by transferring the chemical liquid to the storage tank from a tank lorry.

Hereinafter, the present invention will be specifically described.

The following constituents will be described based on typical embodiments of the present invention in some cases, but the present invention is not limited to the embodiments.

In the present specification, a range of numerical values described using "to" means a range including the numerical values listed before and after "to" as a lower limit and an upper limit respectively.

In the present invention, "preparation" means not only the preparation of a specific material by means of synthesis or mixing but also the preparation of a predetermined substance by means of purchase and the like.

In the present specification, "ppm" means "parts-per-million ($10^{-6}$)", "ppb" means "parts-per-billion ($10^{-9}$)", "ppt" means "parts-per-trillion ($10^{-12}$)", and "ppq" means "parts-per-quadrillion ($10^{-15}$)".

In the present invention, 1 Å (angstrom) equals 0.1 nm.

In the present invention, regarding the description of a group (atomic group), in a case where whether the group is substituted or unsubstituted is not described, as long as the effects of the present invention are not impaired, the group includes a group which does not have a substituent and a group which has a substituent. For example, "hydrocarbon group" includes not only a hydrocarbon group which does not have a substituent (unsubstituted hydrocarbon group) but also a hydrocarbon group which has a substituent (substituted hydrocarbon group). The same is true for each compound.

Furthermore, in the present invention, "radiation" means, for example, far ultraviolet rays, extreme ultraviolet (EUV), X-rays, electron beams, and the like. In addition, in the present invention, light means actinic rays or radiation. In the present invention, unless otherwise specified, "exposure" includes not only exposure, far ultraviolet rays, X-rays, and EUV, and the like, but also lithography by particle beams such as electron beams or ion beams.

[Chemical Liquid]

The aforementioned chemical liquid is a chemical liquid containing an organic solvent, a metal impurity, and an organic impurity. One of the characteristics of the chemical liquid is that the total content of the organic impurity in the chemical liquid with respect to the total mass of the chemical liquid is 0.1 to 10,000 mass ppm, the organic impurity contains an alcohol impurity, and a mass ratio of the content of the alcohol impurity in the chemical liquid to the total content of the organic impurity in the chemical liquid is 0.0001 to 0.5.

According to the examination conducted by the inventors of the present invention, it has been revealed in a case where the chemical liquid, in which the mass ratio of the content of the alcohol impurity in the chemical liquid to the total content of the organic impurity is less than 0.0001, is used as a negative developer, the time taken for development increases. Presumably, this is because the alcohol impurity having high polarity may fail to accelerate the development.

Furthermore, it has been revealed that in a case where the chemical liquid, in which the mass ratio is less than 0.0001, is used as a prewet solution, coating properties deteriorate in some cases. Presumably, this is because the alcohol impurity may fail to reduce the viscosity of the chemical liquid.

In contrast, it has been revealed that in a case where the chemical liquid, in which the mass ratio is higher than 0.5, is used as a negative developer, development proceeds further than intended in some cases. Presumably, this is because the alcohol impurity having high polarity may excessively accelerate development.

In addition, it has been revealed that in a case where the chemical liquid, in which the mass ratio is higher than 0.5, is used as a prewet solution, and coating is performed using a composition for forming a resist film, a resin component frequently contained in the composition for forming a resist film is precipitated, and defect inhibition performance deteriorate in some cases. Presumably, this is because the solubility of the resin component may be reduced by the alcohol impurity.

Presumably, because the chemical liquid contains the metal impurity and the organic impurity, and the mass ratio of the content of the alcohol impurity in the organic impurity to the total content of the organic impurity is adjusted to be within a predetermined range, the effects of the present invention may be obtained.

Hereinafter, each of the components contained in the chemical liquid will be specifically described.

[Organic Solvent]

The chemical liquid contains an organic solvent.

As the organic solvent, known organic solvents can be used without particular limitation.

The content of the organic solvent in the chemical liquid is not particularly limited. However, it is preferable that the chemical liquid contains the organic solvent as a main component. Specifically, the content of the organic solvent with respect to the total mass of the chemical liquid is preferably equal to or greater than 98% by mass, more preferably equal to or greater than 99% by mass, even more preferably equal to or greater than 99.5% by mass, and particularly preferably equal to or greater than 99.8% by mass. The upper limit thereof is not particularly limited, but is preferably equal to or smaller than 99.99% by mass in general. One kind of organic solvent may be used singly, or two or more kinds of organic solvents may be used in combination. In a case where two or more kinds of organic solvents are used in combination, the total content thereof is preferably within the above range.

The content of the organic solvent in the chemical liquid can be measured using gas chromatography mass spectrometry (GCMS). The measurement conditions and the like are as described in Examples which will be described later.

The boiling point of the organic solvent is not particularly limited. However, in view of obtaining a chemical liquid having further improved effects of the present invention, the boiling point of the organic solvent is preferably lower than 200° C.

In the present specification, the boiling point means a boiling point at 1 atm.

The organic solvent is not particularly limited, and examples thereof include methanol, ethanol, 1-propanol, isopropanol, n-propanol, 2-methyl-1-propanol, n-butanol, 2-butanol, tert-butanol, 1-pentanol, 2-pentanol, 3-pentanol, n-hexanol, cyclohexanol, 2-methyl-2-butanol, 3-methyl-2-butanol, 2-methyl-1-butanol, 3-methyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2-ethyl-1-butanol, 2,2-dimethyl-3-pentanol, 2,3-dimethyl-3-pentanol, 2,4-dimethyl-3-pentanol, 4,4-dimethyl-2-pentanol, 3-ethyl-3-pentanol, 1-heptanol, 2-heptanol, 3-heptanol, 2-methyl-2-hexanol, 2-methyl-3-hexanol, 5-methyl-1-hexanol, 5-methyl-2-hexanol, 2-ethyl-1-hexanol, methyl cyclohexanol, trimethyl cyclohexanol, 4-methyl-3-heptanol, 6-methyl-2-heptanol, 1-octanol, 2-octanol, 3-octanol, 2-propyl-1-pentanol, 2,6-dimethyl-4-heptanol, 2-nonanol, 3,7-dimethyl-3-octanol, ethylene glycol, propylene glycol, diethyl ether, dipropyl ether, diisopropyl ether, butyl methyl ether, butyl ethyl ether, butyl propyl ether, dibutyl ether, diisobutyl ether, tert-butyl methyl ether, tert-butyl ethyl ether, tert-butyl propyl ether, di-tert-butyl ether, dipentyl ether, diisoamyl ether, cyclopentyl methyl ether, cyclohexyl methyl ether, bromomethyl methyl ether, α,α-dichloromethyl methyl ether, chloromethyl ethyl ether, 2-chloroethyl methyl ether, 2-bromoethyl methyl ether, 2,2-dichloroethyl methyl ether, 2-chloroethyl ethyl ether, 2-bromoethyl ethyl ether, (±)-1,2-dichloroethyl ethyl ether, 2,2,2-trifluoroethyl ether, ethyl vinyl ether, butyl vinyl ether, allyl ethyl ether, allyl propyl ether, allyl butyl ether, diallyl ether, 2-methoxypropene, ethyl-1-propenylether, cis-1-bromo-2-ethoxyethylene, 2-chloroethyl vinyl ether, allyl-1,1,2,2-tetrafluoroethyl ether, octane, isooctane, nonane, decane, methyl cyclohexane, decalin, xylene, ethyl benzene, diethyl benzene, cumene, sec-butyl benzene, cymene, dipentene, methyl pyruvate, propylene glycol monomethyl ether, propylene glycol monoethyl ether, propylene glycol monopropyl ether, propylene glycol monomethyl ether acetate, ethyl lactate, methyl methoxypropionate, cyclopentanone, cyclohexanone, butyl acetate, isoamyl acetate, amyl aceate, n-amyl acetate, chloroform, dichloromethane, 1,4-dioxane, hexyl alcohol, γ-butyrolactone, 2-heptanone, 2-hydroxymethyl butyrate, cyclohexanone dimethyl acetal, tetrahydrofuran, and the like.

Among these, in view of obtaining a chemical liquid having further improved effects of the present invention, as the organic solvent, at least one kind of compound is more preferable which is selected from the group consisting of propylene glycol monomethyl ether, propylene glycol monoethyl ether, propylene glycol monopropyl ether, propylene glycol monomethyl ether acetate, ethyl lactate, methyl methoxypropionate, hexyl alcohol, 2-heptanone, iso-amyl acetate, cyclopentanone, cyclohexanone, γ-butyrolactone, diisoamyl ether, butyl acetate, 2-hydroxymethyl butyrate, cyclohexanone dimethyl acetal, and 4-methyl-2-pentanol.

In a case where the chemical liquid contains two or more kinds of organic solvents, the combination of the organic solvents contained in the chemical liquid is not particularly limited. In a case where the chemical liquid contains two or more kinds of organic solvents, in view of obtaining a chemical liquid having further improved effects of the present invention, it is preferable that the organic solvents have different boiling points, different solubility parameters, and/or different dielectric constants.

For example, a chemical liquid containing two or more kinds of organic solvents having different dielectric constants has further improved defect inhibition performance, although the reason is unclear. Presumably, this is because the occurrence of a defect by static electricity may be further inhibited. For example, butyl acetate and isoamyl acetate may be used by being mixed together in any mass.

In a case where the chemical liquid contains two or more kinds of organic solvents, it is preferable that the chemical liquid contains two or more kinds of ethers as the organic solvents. The chemical liquid containing two or more kinds of ethers (corresponding to organic solvents) has further improved defect inhibition performance.

As the ethers, known ethers can be used without particular limitation. As the two or more kinds of ethers, for example, two or more kinds of ethers are preferable which are selected from the group consisting of propylene glycol monomethyl ether acetate, propylene glycol monomethyl ether, diethylene glycol monomethyl ether, diethylene glycol monoethyl ether, and diethylene glycol monobutyl ether.

It is preferable that the organic solvents contain propylene glycol monomethyl ether acetate and propylene glycol monomethyl ether among the above.

In a case where the chemical liquid contains two or more kinds of organic solvents, the mass ratio of the organic solvents in the chemical liquid is not particularly limited but is preferably 1/99 to 99/1 in general, more preferably 10/90 to 90/10, and even more preferably 20/80 to 60/40.

In a case where the chemical liquid contains three or more kinds of organic solvents, the combination of the three or more kinds of organic solvents is not particularly limited, but the following combinations of organic solvents and the like are preferable.

Propylene glycol monomethyl ether acetate (PGMEA)/propylene glycol monomethyl ether (PGME)/γ-butyrolactone
PGMEA/PGME/cyclohexanone
PGMEA/PGME/2-heptanone
PGMEA/cyclohexanone/γ-butyrolactone
PGMEA/γ-butyrolactone/2-heptanone

[Organic Impurity]

The chemical liquid contains an organic impurity.

In the present specification, the organic impurity means an organic substance as a compound which is different from the organic solvent contained in the chemical liquid as a main component and is contained in the chemical liquid in an amount equal to or smaller than 10,000 mass ppm with respect to the total mass of the chemical liquid. That is, in the present specification, an organic substance which is contained in the chemical liquid in an amount equal to or smaller than 10,000 mass ppm with respect to the total mass of the chemical liquid corresponds to an organic impurity but does not correspond to an organic solvent.

In a case where the chemical liquid contains an organic impurity formed of a plurality of kinds of compounds, as long as each of the compounds corresponds to the aforementioned organic substance which is contained in the chemical liquid in an amount equal to or smaller than 10,000 mass ppm, each of the compounds corresponds to the organic impurity.

The organic impurity may be added to the chemical liquid or may be unintentionally mixed into the chemical liquid in the manufacturing process of the chemical liquid. Examples of the case where the organic impurity is unintentionally mixed into the chemical liquid in the manufacturing process of the chemical liquid include a case where the organic impurity is contained in a raw material (for example, an organic solvent) used for manufacturing the chemical liquid, a case where the organic impurity is mixed into the chemical liquid in the manufacturing process of the chemical liquid (for example, contamination), and the like. However, the present invention is not limited to these The total content of the organic impurity in the chemical liquid with respect to the total mass of the chemical liquid is 0.1 to 10,000 mass ppm, more preferably 0.1 to 8,000 mass ppm, and even more preferably 0.1 to 3,000 mass ppm. In a case where the total content of the organic impurity is 0.1 to 8,000 mass ppm, the chemical liquid has further improved defect inhibition performance.

One kind of organic impurity may be used singly, or two or more kinds of organic impurities may be used in combination. In a case where two or more kinds of organic impurities are used in combination, the total content thereof is preferably within the above range.

The total content of the organic impurity in the chemical liquid can be measured using gas chromatography mass spectrometry (GCMS). The measurement conditions and the like are as described in Examples.

The mass ratio of the content of the alcohol impurity, which will be described later, to the total content of the organic impurity (content of alcohol impurity/total content of organic impurity) is 0.0001 to 0.5, and preferably 0.0001 to 0.1. In a case where the mass ratio is within a range of 0.0001 to 0.5, the chemical liquid has further improved developability.

Examples of the organic impurity include antioxidants such as dibutylhydroxytoluene (BHT), distearylthiodipropionate (DSTP), 4,4'-butylidenebis-(6-t-butyl-3-methylphenol), 2,2'-methylenebis-(4-ethyl-6-t-butylphenol), and the antioxidants described in JP2015-200775A; unreacted raw materials; structural isomers and byproducts produced at the time of manufacturing the organic solvent; substances eluted from members constituting an organic solvent manufacturing device and the like (for example, a plasticizer eluted from a rubber member such as an O-ring); and the like.

Examples of the organic impurity include byproducts generated at the time of synthesizing the organic solvent and/or unreacted raw materials (hereinafter, referred to as "byproduct and the like" as well), and the like. For example, in a case where the organic solvent is an alcohol compound, a ketone compound, an ester compound, an ether compound, and an aldehyde compound, examples of the byproduct and the like include an alcohol compound, a ketone compound, an ester compound, an ether compound, an aldehyde compound, and the like.

Examples of the byproduct and the like include compounds represented by Formulae I to V, and the like.

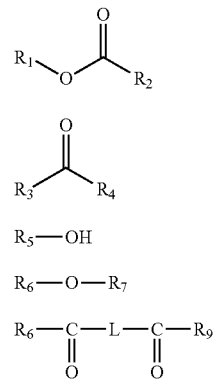

In Formula I, $R_1$ and $R_2$ each independently represent an alkyl group or a cycloalkyl group. Alternatively, $R_1$ and $R_2$ form a ring by being bonded to each other.

As the alkyl group or the cycloalkyl group represented by $R_1$ and $R_2$, an alkyl group having 1 to 12 carbon atoms or a cycloalkyl group having 6 to 12 carbon atoms is preferable, and an alkyl group having 1 to 8 carbon atoms or a cycloalkyl group having 6 to 8 carbon atoms is more preferable.

The ring formed of $R_1$ and $R_2$ bonded to each other is a lactone ring, preferably a 4- to 9-membered lactone ring, and more preferably a 4- to 6-membered lactone ring.

It is preferable that $R_1$ and $R_2$ satisfy a relationship in which the number of carbon atoms in the compound represented by Formula I becomes equal to or greater than 6.

In Formula II, $R_3$ and $R_4$ each independently represent a hydrogen atom, an alkyl group, an alkenyl group, a cycloalkyl group, or a cycloalkenyl group. Alternatively, $R_3$ and $R_4$ form a ring by being bonded to each other. Here, $R_3$ and $R_4$ do not simultaneously represent a hydrogen atom.

As the alkyl group represented by $R_3$ and $R_4$, for example, an alkyl group having 1 to 12 carbon atoms is preferable, and an alkyl group having 1 to 8 carbon atoms is more preferable.

As the alkenyl group represented by $R_3$ and $R_4$, for example, an alkenyl group having 2 to 12 carbon atoms is preferable, and an alkenyl group having 2 to 8 carbon atoms is more preferable.

As the cycloalkyl group represented by $R_3$ and $R_4$, for example, a cycloalkyl group having 6 to 12 carbon atoms is preferable, and a cycloalkyl group having 6 to 8 carbon atoms is more preferable.

As the cycloalkenyl group represented by $R_3$ and $R_4$, for example, a cycloalkenyl group having 3 to 12 carbon atoms is preferable, and a cycloalkenyl group having 6 to 8 carbon atoms is more preferable.

The ring formed of $R_3$ and $R_4$ bonded to each other is a cyclic ketone structure which may be a saturated cyclic ketone or an unsaturated cyclic ketone. The cyclic ketone is preferably a 6- to 10-membered ring, and more preferably a 6- to 8-membered ring.

It is preferable that $R_3$ and $R_4$ satisfy a relationship in which the number of carbon atoms in the compound represented by Formula II becomes equal to or greater than 6.

In Formula III, $R_5$ represents an alkyl group or a cycloalkyl group.

As the alkyl group represented by $R_5$, an alkyl group having 6 or more carbon atoms is preferable, an alkyl group having 6 to 12 carbon atoms is more preferable, and an alkyl group having 6 to 10 carbon atoms is even more preferable.

The alkyl group may have an ether bond in the chain thereof or may have a substituent such as a hydroxy group.

As the cycloalkyl group represented by $R_5$, a cycloalkyl group having 6 or more carbon atoms is preferable, a cycloalkyl group having 6 to 12 carbon atoms is more preferable, and a cycloalkyl group having 6 to 10 carbon atoms is even more preferable.

In Formula IV, $R_6$ and $R_7$ each independently represent an alkyl group or a cycloalkyl group. Alternatively, $R_6$ and $R_7$ form a ring by being bonded to each other.

As the alkyl group represented by $R_6$ and $R_7$, an alkyl group having 1 to 12 carbon atoms is preferable, and an alkyl group having 1 to 8 carbon atoms is more preferable.

As the cycloalkyl group represented by $R_6$ and $R_7$, a cycloalkyl group having 6 to 12 carbon atoms is preferable, and a cycloalkyl group having 6 to 8 carbon atoms is more preferable.

The ring formed of $R_6$ and $R_7$ bonded to each other is a cyclic ether structure. The cyclic ether structure is preferably a 4- to 8-membered ring, and more preferably a 5- to 7-membered ring.

It is preferable that $R_6$ and $R_7$ satisfy a relationship in which the number of carbon atoms in the compound represented by Formula IV becomes equal to or greater than 6.

In Formula V, $R_8$ and $R_9$ each independently represent an alkyl group or a cycloalkyl group. Alternatively, $R_8$ and $R_9$ form a ring by being bonded to each other. L represents a single bond or an alkylene group.

As the alkyl group represented by $R_8$ and $R_9$, an alkyl group having 6 to 12 carbon atoms is preferable, and an alkyl group having 6 to 10 carbon atoms is more preferable.

As the cycloalkyl group represented by $R_8$ and $R_9$, a cycloalkyl group having 6 to 12 carbon atoms is preferable, and a cycloalkyl group having 6 to 10 carbon atoms is more preferable.

The ring formed of $R_8$ and $R_9$ bonded to each other is a cyclic diketone structure. The cyclic diketone structure is preferably a 6- to 12-membered ring, and more preferably a 6- to 10-membered ring.

As the alkylene group represented by L, for example, an alkylene group having 1 to 12 carbon atoms is preferable, and an alkylene group having 1 to 10 carbon atoms is more preferable.

$R_8$, $R_9$, and L satisfy a relationship in which the number of carbon atoms in the compound represented by Formula V becomes equal to or greater than 6.

The organic impurity is not particularly limited. However, in a case where the organic solvents are an amide compound, an imide compound, and a sulfoxide compound, in an aspect, examples of the organic impurity include an amide compound, an imide compound, and a sulfoxide compound having 6 or more carbon atoms. Examples thereof include the following compounds.

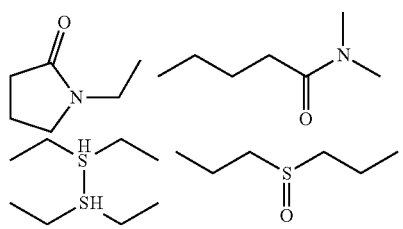

<Alcohol Impurity>

The organic impurity contains an alcohol impurity.

As the alcohol impurity, an alcohol impurity containing one or more alcoholic hydroxyl groups in one molecule can be used without particular limitation.

In the present specification, the alcohol impurity is an organic impurity containing one or more alcoholic hydroxyl groups.

The alcohol impurity may be added to the chemical liquid or unintentionally mixed into the chemical liquid in the manufacturing process of the chemical liquid. Examples of the case where the alcohol impurity is unintentionally mixed into the chemical liquid in the manufacturing process of the chemical liquid include a case where the alcohol impurity is contained in a raw material (for example, an organic solvent) used for manufacturing the chemical liquid, a case where the alcohol impurity is mixed into the chemical liquid in the manufacturing process of the chemical liquid (for example, contamination), and the like. However, the present invention is not limited to these.

The content of the alcohol impurity in the chemical liquid with respect to the total mass of the chemical liquid is preferably 0.05 to 5,000 mass ppm, and more preferably 0.1 to 3,000 mass ppm.

One kind of alcohol impurity may be used singly, or two or more kinds of alcohol impurities may be used in combination. In a case where two or more kinds of alcohol impurities are used in combination, the total content thereof is preferably within the above range.

The alcohol impurity is not particularly limited, and examples thereof include linear, branched, and cyclic alcohols. Examples of monohydric alcohol impurities include methanol, ethanol, propanol, isopropanol, 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol, and the like. Examples of alcohol impurities having two or more hydroxyl groups include alkylene glycol, glycerin, and the like.

[Metal Impurity]

The chemical liquid contains a metal impurity. The metal impurity contains metal atoms. The form of the metal impurity is not particularly limited. In the present specification, the metal impurity containing metal atoms means a metal impurity contained in the chemical liquid in the form of a metal ion or a solid (particle-like metal-containing compound or the like).

In the present specification, the total content of the metal atoms contained in the metal impurity in the chemical liquid means the content of the metal atoms measured by inductively coupled plasma mass spectrometry (ICP-MS). The method for measuring the content of the metal atoms by using ICP-MS is as described in Examples which will be described later.

In the chemical liquid, the total content of the metal atoms contained in the metal impurity with respect to the total mass of the chemical liquid is equal to or smaller than 50 mass ppt, and preferably equal to or smaller than 30 mass ppt. The lower limit of the total content of the metal atoms is not particularly limited, but is preferably equal to or greater than 0.05 mass ppt in general.

One kind of metal impurity may be used singly, or two or more kinds of metal impurities may be used in combination. In a case where two or more kinds of metal impurities are used in combination, the total content of the metal atoms is preferably within the above range.

The metal impurity may be added to the chemical liquid or may be unintentionally mixed into the chemical liquid in the manufacturing process of the chemical liquid. Examples of the case where the metal impurity is unintentionally mixed into the chemical liquid in the manufacturing process of the chemical liquid include a case where the metal impurity is contained in a raw material (for example, an organic solvent) used for manufacturing the chemical liquid, a case where the metal impurity is mixed into the chemical liquid in the manufacturing process of the chemical liquid (for example, contamination), and the like. However, the present invention is not limited to these.

Particularly, in view of obtaining a chemical liquid having further improved effects of the present invention, the metal impurity more preferably contains a Fe atom, a Ni atom, a Cr atom, and a Pb atom, and the mass ratio of the content of each of the above atoms to the total content of the metal atoms contained in the metal impurity in the chemical liquid is more preferably within the following range. In a case where the mass ratio of the content of each atom is within the following range, the chemical liquid has further improved defect inhibition performance.

Fe atom: 0.01 to 0.5
Cr atom: 0.01 to 0.5
Ni atom: 0.01 to 0.5
Pb atom: 0.005 to 0.3

Particularly, in view of obtaining a chemical liquid having further improved effects of the present invention, the mass ratio of the content of each atom to the total content of the metal atoms is even more preferably within the following range.

Fe atom: 0.01 to 0.3
Cr atom: 0.01 to 0.3
Ni atom: 0.01 to 0.3
Pb atom: 0.01 to 0.15

[Optional Component]

As long as the effects of the present invention are exhibited, the chemical liquid may contain other components in addition to the components described above. Examples of other components include water.

[Water]

The chemical liquid may contain water. As the water, for example, distilled water, deionized water, pure water, and the like can be used without particular limitation.

Water may be added to the chemical liquid or may be unintentionally mixed into the chemical liquid in the manufacturing process of the chemical liquid. Examples of the case where water is unintentionally mixed into the chemical liquid in the manufacturing process of the chemical liquid include a case where water is contained in a raw material (for example, an organic solvent) used for manufacturing the chemical liquid, a case where water is mixed into the chemical liquid in the manufacturing process of the chemical liquid (for example, contamination), and the like. However, the present invention is not limited to these.

The content of water in the chemical liquid is not particularly limited. Generally, the content of water with respect to the total mass of the chemical liquid is preferably 0.05% to 2.0% by mass, and more preferably 0.1% to 1.5% by mass.

In a case where the content of water in the chemical liquid is 0.1% to 1.5% by mass, the chemical liquid has further improved defect inhibition performance.

In a case where the content of water is equal to or greater than 0.1% by mass, the metal component is not easily eluted. In a case where the content of water is equal to or smaller than 1.5% by mass, water is inhibited from becoming the cause of a defect.

In the present specification, the content of water means a moisture content measured using a device which adopts the Karl Fischer moisture measurement method as the principle of measurement. The measurement method performed by the device is as described in Examples which will be described later.

[Physical Properties of Chemical Liquid]

It is preferable that the chemical liquid has the following physical properties, because then the chemical liquid has further improved effects of the present invention.

(1) The mass ratio of the total content of a component having a boiling point equal to or higher than 250° C. to the total content of a component having a boiling point lower than 250° C. is 0.000001 to 0.001.

(2) The number of objects to be counted having a size of equal to or greater than 0.1 μm that are counted by a light scattering-type liquid-borne particle counter is equal to or smaller than 100/mL.

Hereinafter, the physical properties (1) and (2) of the chemical liquid will be described.

<Physical property 1: mass ratio of total content of component having boiling point equal to or higher than 250° C. to total content of component having boiling point lower than 250° C. is 0.00001 to 0.001.>

The mass ratio (high-boiling-point compound/low-boiling-point compound) of the total content of the component (high-boiling-point compound), which is contained in the chemical liquid and has a boiling point (boiling point at 1 atm, the same is true for the following description) equal to or higher than 250° C., to the total content of the component (low-boiling-point compound), which is contained in the chemical liquid and has a boiling point lower than 250° C., is not particularly limited. However, in view of obtaining a chemical liquid having further improved effects of the present invention, the mass ratio is preferably 0.000005 to 0.005, more preferably 0.00001 to 0.001, and even more preferably 0.00001 to 0.0001.

In a case where the mass ratio is within a range of 0.00001 to 0.001, the chemical liquid has further improved defect inhibition performance.

In a case where the mass ratio is equal to or greater than 0.00001, the chemical liquid has further improved temporal stability, although the reason is unclear. The inventors of the present invention assume that this is because the high-boiling-point compound may act as an antioxidant in the chemical liquid. In the present specification, the temporal stability of the chemical liquid means the temporal stability of the chemical liquid measured by the method described in Examples.

Examples of the high-boiling-point compound in the chemical liquid include a component such an organic impurity or an organic solvent having a boiling point equal to or higher than 250° C., and the like.

Examples of the component include dioctyl phthalate (boiling point: 385° C.), diisononyl phthalate (boiling point: 403° C.), dioctyl adipate (boiling point: 335° C.), dibutyl phthalate (boiling point: 340° C.), ethylene propylene rubber (boiling point: 300° C. to 450° C.), and the like, but the present invention is not limited to these.

Examples of the low-boiling-point compound in the chemical liquid include an organic impurity having a boiling point lower than 200° C., an organic solvent, and the like.

The aforementioned mass ratio can be determined by quantifying each of the components in the chemical liquid by using the method described above, classifying the quantified components into a high-boiling-point compound and a low-boiling-point compound according to the boiling point thereof, and calculating the mass ratio from the total content of the compounds.

<Physical property 2: number of objects to be counted having size equal to or greater than 0.1 μm that are counted by light scattering-type liquid-borne particle counter is equal to or smaller than 100/mL>

In view of making the chemical liquid have further improved effects of the present invention, the number of objects to be counted having a size equal to or greater than 0.1 μm that are counted by a light scattering-type liquid-borne particle counter is preferably equal to or smaller than 100/mL.

In the present specification, the objects to be counted having a size equal to or greater than 0.1 μm that are counted by a light scattering-type liquid-borne particle counter are referred to as "coarse particles" as well.

Examples of the coarse particles include particles (particles of dirt, dust, organic solids, inorganic solids, and the like) contained in a raw material (for example, an organic solvent) used for manufacturing the chemical liquid, particles (dirt, dust, solids (formed of organic substances, inorganic substances, and/or metals)) incorporated as contaminants into the chemical liquid while the chemical liquid is being prepared, and the like. However, the present invention is not limited to these.

The coarse particles also include a colloidized impurity containing metal atoms. The metal atoms are not particularly limited. However, in a case where the content of at least one kind of metal atom selected from the group consisting of Na, K, Ca, Fe, Cu, Mg, Mn, Li, Al, Cr, Ni, Zn, and Pb (preferably Fe, Cr, Ni, and Pb) is particularly small (for example, in a case where the content of each of the aforementioned metal atoms in the organic solvent is equal to or smaller than 1,000 mass ppt), the impurity containing these metal atoms is easily colloidized.

[Manufacturing Method of Chemical Liquid]

As the manufacturing method of the chemical liquid, known manufacturing methods can be used without particular limitation. Particularly, in view of more simply obtaining the chemical liquid, a manufacturing method of a chemical liquid having the following step (2) is preferable, and a manufacturing method of a chemical liquid having the following steps in the following order is more preferable. Hereinafter, each of the steps will be specifically described.

(1) Preparation step of preparing substance to be purified containing organic solvent (2) Purification step of purifying substance to be purified so as to obtain chemical liquid <(1) Preparation Step>

The preparation step is a step of preparing a substance to be purified containing an organic solvent. The method for preparing the substance to be purified is not particularly limited, and examples thereof include methods such as preparing the substance to be purified containing an organic solvent by purchase and obtaining the substance to be purified containing an organic solvent by reacting raw materials (the organic solvent is a reaction product). As the substance to be purified, it is preferable to prepare a substance in which the content of the aforementioned metal impurity containing metal atoms and/or the aforementioned organic impurity is small (for example, a substance in which the content of an organic solvent is equal to or greater than 99% by mass). Examples of commercial products of the substance to be purified containing an organic solvent include those called "high-purity grade products" of "organic solvents".

As the method for obtaining the organic solvent as a reaction product by reacting raw materials, known methods can be used without particular limitation. Examples thereof include a method for obtaining an organic solvent as a reaction product by reacting a single raw material or a plurality of raw materials in the presence of a catalyst.

More specifically, examples of the method include a method for obtaining butyl acetate by reacting acetic acid and n-butanol in the presence of sulfuric acid; a method for obtaining 1-hexanol by reacting ethylene, oxygen, and water in the presence of $Al(C_2H_5)_3$; a method for obtaining 4-methyl-2-pentanol by reacting cis-4-methyl-2-pentene in the presence of Diisopinocampheylborane (Ipc2BH); a method for obtaining propylene glycol 1-monomethyl ether 2-acetate (PGMEA) by reacting propylene oxide, methanol, and acetic acid in the presence of sulfuric acid; a method for obtaining isopropyl alcohol (IPA) by reacting acetone and hydrogen in the presence of copper oxide-zinc oxide-aluminum oxide; a method for obtaining ethyl lactate by reacting lactic acid and ethanol; and the like.

<(2) Purification Step>

The purification step is a step of purifying the substance to be purified so as to obtain a chemical liquid having desired physical properties.

As the purification method of the substance to be purified, known methods can be used without particular limitation. It is preferable that the purification method of the substance to be purified includes at least one kind of step selected from the group consisting of the steps described below. Hereinafter, each of the steps will be specifically described.

In the purification step, each of the following steps may be performed once or plural times. Furthermore, the order of the following steps is not particularly limited.

Distillation step

Component adjustment step (Distillation Step)

It is preferable that (2) purification step includes a distillation step. The distillation step means a step of distilling the substance to be purified so as to obtain a substance to be purified or a chemical liquid having undergone purification (hereinafter, referred to as "purified substance" as well). As the distillation method, known methods can be used without particular limitation.

Particularly, in view of more simply obtaining a purified substance and making it more difficult for impurities to be unintentionally mixed into the purified substance in the distillation step, it is preferable to distill the substance to be purified by using the following purification device.

•Purification Device

As an aspect of the purification device which can be used in the distillation step, for example, a purification device can be exemplified which has a distillation column for distilling the substance to be purified containing an organic solvent, in which a liquid contact portion of the distillation column is formed of at least one kind of material selected from the group consisting of a nonmetallic material and an electropolished metallic material.

In the present specification, the liquid contact portion means a portion which is likely to contact at least either the substance to be purified or the chemical liquid in the purification device and the like. The liquid contact portion is not limited, but means, for example, the interior wall, the pipe line, and the like of the purification device.

As the nonmetallic material, known materials can be used without particular limitation.

Examples of the nonmetallic material include at least one kind of material selected from the group consisting of a polyethylene resin, a polypropylene resin, a polyethylene-polypropylene resin, polytetrafluoroethylene, a tetrafluoroethylene-perfluoroalkyl vinyl ether copolymer, a tetrafluoroethylene-hexafluoropropylene copolymer resin, a tetrafluoroethylene-ethylene copolymer resin, a chlorotrifluoro ethylene-ethylene copolymer resin, a vinylidene fluoride resin, a chlorotrifluoroethylene copolymer resin, and a vinyl fluoride resin. However, the present invention is not limited to these.

As the metallic material, known materials can be used without particular limitation.

Examples of the metallic material include a metallic material in which the total content of chromium and nickel with respect to the total mass of the metallic material is greater than 25% by mass. The total content of chromium and nickel is more preferably equal to or greater than 30% by mass. The upper limit of the total content of chromium and nickel in the metallic material is not particularly limited, but is preferably equal to or smaller than 90% by mass in general.

Examples of the metallic material include stainless steel, a nickel-chromium alloy, and the like.

As the stainless steel, known stainless steel can be used without particular limitation. Among these, an alloy with a nickel content equal to or higher than 8% by mass is preferable, and austenite-based stainless steel with a nickel content equal to or higher than 8% by mass is more preferable. Examples of the austenite-based stainless steel include Steel Use Stainless (SUS) 304 (Ni content: 8% by mass, Cr content: 18% by mass), SUS304L (Ni content: 9% by mass, Cr content: 18% by mass), SUS316 (Ni content: 10% by mass, Cr content: 16% by mass), SUS316L (Ni content: 12% by mass, Cr content: 16% by mass), and the like.

As the nickel-chromium alloy, known nickel-chromium alloys can be used without particular limitation. Among these, a nickel-chromium alloy is preferable in which the nickel content is 40% to 75% by mass and the chromium content is 1% to 30% by mass with respect to the total mass of the metallic material.

Examples of the nickel-chromium alloy include HASTELLOY (tradename, the same is true for the following description), MONEL (tradename, the same is true for the following description), INCONEL (tradename, the same is true for the following description), and the like. More specifically, examples thereof include HASTELLOY C-276 (Ni content: 63% by mass, Cr content: 16% by mass), HASTELLOY C (Ni content: 60% by mass, Cr content: 17% by mass), HASTELLOY C-22 (Ni content: 61% by mass, Cr content: 22% by mass), and the like.

Furthermore, if necessary, the nickel-chromium alloy may further contain boron, silicon, tungsten, molybdenum, copper, cobalt, and the like in addition to the aforementioned alloy.

As the method for electropolishing the metallic material, known methods can be used without particular limitation. For example, it is possible to use the methods described in paragraphs [0011] to [0014] in JP2015-227501A, paragraphs [0036] to [0042] in JP2008-264929A, and the like.

Presumably, in a case where the metallic material is electropolished, the chromium content in a passive layer on the surface thereof may become higher than the chromium content in the parent phase. For this reason, from the distillation column in which the liquid contact portion is formed of an electropolished metallic material, the metal impurity containing metal atoms may not easily flow into the substance to be purified and the purified substance, and hence a purified substance with a reduced impurity content can be obtained.

The metallic material may have undergone buffing. As the buffing method, known methods can be used without particular limitation. The size of abrasive grains used for finishing the buffing is not particularly limited, but is preferably equal to or smaller than #400 because such grains make it easy to further reduce the surface asperity of the metallic material. The buffing is preferably performed before the electropolishing.

•Purification Device (Another Aspect)

As another aspect of the purification device which can be used in the distillation step, a purification device can be exemplified which comprises a reaction portion for obtaining an organic solvent, which is a reaction product, by reacting raw materials, the distillation column described above, and a transfer pipe line which connects the reaction portion and the distillation column to each other so as to transfer the reactant to the distillation column from the reaction portion.

The reaction portion has a function of obtaining an organic solvent, which is a reactant, by reacting the supplied raw materials (if necessary, in the presence of a catalyst). As the reaction portion, known reaction portions can be used without particular limitation.

Examples of the reaction portion include an aspect including a reactor to which raw materials are supplied and in which a reaction proceeds, a stirring portion provided in the interior of the reactor, a lid portion joined to the reactor, an injection portion for injecting the raw materials into the reactor, and a reactant outlet portion for taking the reactant out of the reactor. By continuously or non-continuously injecting the raw materials into the reaction portion and reacting the injected raw materials (in the presence of a catalyst), an organic solvent which is a reaction product can be obtained.

If desired, the reaction portion may also include a reactant isolation portion, a temperature adjustment portion, a sensor portion including a level gauge, a manometer, and a thermometer, and the like.

It is preferable that the liquid contact portion (for example, the interior wall of the liquid contact portion of the reactor, or the like) of the reaction portion is formed of at least one kind of material selected from the group consisting of a nonmetallic material and an electropolished metallic material. The aspect of each of the aforementioned materials is as described above.

In a case where the purification device including the reaction portion is used, a purified substance with a further reduced impurity content is obtained.

In the purification device according to the above aspect, the reaction portion and the distillation column are connected to each other through the transfer pipe line. Because the reaction portion and the distillation column are connected to each other through the transfer pipe line, the transfer of the substance to be purified to the distillation column from the reaction portion is carried out in a closed system, and impurities including a metal impurity are inhibited from being mixed into the substance to be purified from the environment. Accordingly, a purified substance with a further reduced impurity content can be obtained.

As the transfer pipe line, known transfer pipe lines can be used without particular limitation. As the transfer pipe line, an aspect comprising a pipe, a pump, a valve, and the like can be exemplified.

It is preferable that the liquid contact portion of the transfer pipe line is formed of at least one kind of material selected from the group consisting of a nonmetallic material and an electropolished metallic material. The aspect of each of the aforementioned materials is as described above.

In a case where the purification device comprising the transfer pipe line is used, it is possible to more simply obtain a purified substance with a further reduced impurity content.

(Component Adjustment Step)

It is preferable that (2) purification step described above includes a component adjustment step.

The component adjustment step is a step of adjusting the content of the metal impurity, the organic impurity, water, and the like contained in the substance to be purified.

As the method for adjusting the content of the metal impurity, the organic impurity, water, and the like contained in the substance to be purified, known methods can be used without particular limitation.

Examples of the method for adjusting the content of the metal impurity, the organic impurity, water, and the like contained in the substance to be purified include a method for adding a metal impurity, an organic impurity, water, and the like in a predetermined amount to the substance to be purified, a method for removing a metal impurity, an organic impurity, water, and the like from the substance to be purified, and the like.

As the method for removing a metal impurity, an organic impurity, and water, and the like from the substance to be purified, known methods can be used without particular limitation.

As the method for removing a metal impurity, an organic impurity, water, and the lie from the substance to be purified, for example, a method for filtering the substance to be purified through a filter (hereinafter, a step of performing the filtering will be referred to as "filtering step") is preferable. The method for filtering the substance to be purified through a filter is not particularly limited, and examples thereof include a method for disposing a filter unit comprising a filter and a filter housing in the middle of a transfer pipe line transferring the substance to be purified and passing the substance to be purified through the filter unit with or without applying pressure thereto.

As the filter, known filters can be used without particular limitation.

•Filtering Step

It is preferable that the component adjustment step includes a filtering step.

As the filter used in the filtering step, known filters can be used without particular limitation.

Examples of the material of the filter used in the filtering step include a fluororesin such as polytetrafluoroethylene (PTFE), a polyamide-based resin such as nylon, a polyolefin resin (including a polyolefin resin with high density and ultra-high molecular weight) such as polyethylene and polypropylene (PP), and the like. Among these, a polyamide-based resin, PTFE, and polypropylene (including high-density polypropylene) are preferable. In a case where filters formed of these materials are used, foreign substances with high polarity, which readily become the cause of a particle defect, can be efficiently removed, and the amount of the metal component (metal impurity) can be efficiently reduced.

The lower limit of the critical surface tension of the filter is preferably equal to or higher than 70 mN/m. The upper limit thereof is preferably equal to or lower than 95 mN/m. The critical surface tension of the filter is more preferably equal to or higher than 75 mN/m and equal to or lower than 85 mN/m.

The value of the critical surface tension is the nominal value from manufacturers. In a case where a filter having critical surface tension within the above range is used, foreign substances with high polarity, which readily become the cause of a particle defect, can be effectively removed, and the amount of the metal component (metal impurity) can be efficiently reduced.

The pore size of the filter is preferably about 0.001 to 1.0 μm, more preferably about 0.01 to 0.5 μm, and even more preferably about 0.01 to 0.1 μm. In a case where the pore size of the filter is within the above range, it is possible to inhibit the clogging of the filter and to reliably remove minute foreign substances contained in the substance to be purified.

At the time of using the filter, different filters may be combined. At this time, filtering carried out using a first filter may be performed once or performed two or more times. In a case where filtering is performed two or more times by using different filters in combination, the filters may be of the same type or different types, but it is preferable that the filters are of different types. Typically, it is preferable that at least one of the pore size or the constituent material varies between the first filter and the second filter.

It is preferable that the pore size for the second filtering and the next filtering is the same as or smaller than the pore size for the first filtering. Furthermore, first filters having different pore sizes within the above range may be combined. As the pore size mentioned herein, the nominal values form filter manufacturers can be referred to. A commercial filter can be selected from various filters provided from, for example, Pall Corporation Japan, Advantec Toyo Kaisha, Ltd., Nihon Entegris KK (former MICRONICS JAPAN CO., LTD.), KITZ MICRO FILTER CORPORATION, or the like. In addition, it is possible to use "P-NYLON FILTER (pore size: 0.02 μm, critical surface tension: 77 mN/m)" made of polyamide; (manufactured by Pall Corporation Japan), "PE·CLEAN FILTER (pore size: 0.02 μm)" made of high-density polyethylene; (manufactured by Pall Corporation Japan), and "PE·CLEAN FILTER (pore size: 0.01 μm)" made of high-density polyethylene; (manufactured by Pall Corporation Japan).

For example, from the viewpoint of allowing the chemical liquid according to the embodiment of the present invention to bring about desired effects and from the viewpoint of inhibiting the increase of the metal impurity (particularly, a metal impurity present in the chemical liquid as a solid) during the storage of the purified chemical liquid, provided that an interaction radius in the Hansen solubility parameter space (HSP) derived from the material of the filter used for filtering is R0, and that a radius of a sphere in the Hansen space derived from the organic solvent contained in the substance to be purified is Ra, it is preferable that the substance to be purified and the material of the filter used for filtering are combined such that the substance to be purified and the filter have a relationship satisfying a relational expression of $(Ra/R0) \leq 1$, and the substance to be purified is preferably filtered through a filter material satisfying the relational expression, although the combination of the substance to be purified and the filter is not particularly limited. $Ra/R0$ is preferably equal to or smaller than 0.98, and more preferably equal to or smaller than 0.95. The lower limit of Ra/R0 is preferably equal to or greater than 0.5, more preferably equal to or greater than 0.6, and even more preferably 0.7. In a case where Ra/R0 is within the above range, the increase in the content of the metal impurity in the chemical liquid during long-term storage is inhibited, although the mechanism is unclear.

The combination of the filter and the substance to be purified is not particularly limited, and examples thereof include those described in US2016/0089622.

As a second filter, a filter formed of the same material as the aforementioned first filter can be used. Furthermore, a filter having the same pore size as the aforementioned first filter can be used. In a case where a filter having a pore size smaller than that of the first filter is used as the second filter, a ratio between the pore size of the second filter and the pore size of the first filter (pore size of second filter/pore size of first filter) is preferably 0.01 to 0.99, more preferably 0.1 to 0.9, and even more preferably 0.2 to 0.9. In a case where the pore size of the second filter is within the above range, fine foreign substances mixed into the solution are more reliably removed.

The filtering pressure affects the filtering accuracy. Therefore, it is preferable that the pulsation of pressure at the time of filtering is as low as possible.

In the manufacturing method of a chemical liquid, the filtering speed is not particularly limited. However, in view of obtaining a chemical liquid having further improved effects of the present invention, the filtering speed is preferably equal to or higher than 1.0 L/min/m$^2$, more preferably equal to or higher than 0.75 L/min/m$^2$, and even more preferably equal to or higher than 0.6 L/min/m$^2$.

For the filter, an endurable differential pressure for assuring the filter performance (assuring that the filter will not be broken) is set. In a case where the endurable differential pressure is high, by increasing the filtering pressure, the filtering speed can be increased. That is, it is preferable that the upper limit of the filtering speed is generally equal to or lower than 10.0 L/min/m$^2$ although the upper limit usually depends on the endurable differential pressure of the filter.

In the manufacturing method of a chemical liquid, in view of obtaining a chemical liquid having further improved effects of the present invention, the filtering pressure is preferably 0.001 to 1.0 MPa, more preferably 0.003 to 0.5 MPa, and even more preferably 0.005 to 0.3 MPa. Particularly, in a case where a filter having a small pore size is used, by increasing the filtering pressure, it is possible to efficiently reduce the amount of particle-like foreign substances or impurities dissolved in the substance to be purified. In a case where a filter having a pore size smaller than 20 nm is used, the filtering pressure is particularly preferably 0.005 to 0.3 MPa.

The smaller the pore size of the filtration filter, the lower the filtering speed. However, for example, in a case where a plurality of filtration filters of the same type are connected to each other in parallel, the filtering area is enlarged, and the filtering pressure is reduced. Therefore, in this way, the reduction in the filtering speed can be compensated.

It is more preferable that the filtering step includes the following steps. In the filtering step, each of the following steps may be performed once or plural times. Furthermore, the order of the following steps is not particularly limited.

1. Particle removing step
2. Metal ion removing step
3. Organic impurity removing step
4. Ion exchange step Hereinafter, each of the steps will be described.

••Particle Removing Step

The particle removing step is a step of removing the coarse particles and/or the metal impurity (particularly, the metal impurity present as a solid in the chemical liquid) in the substance to be purified by using a particle removing filter. As the particle removing filter, known particle removing filters can be used without particular limitation.

Examples of the particle removing filter include a filter for removing particles having a diameter equal to or smaller than 20 nm. In a case where the organic solvent is filtered using the above filter, the coarse particles can be removed from the organic solvent (the aspect of the coarse particles is as described above).

The diameter of the particles to be removed is preferably 1 to 15 nm, and more preferably 1 to 12 nm. In a case where the diameter of the particles to be removed is equal to or smaller than 15 nm, finer coarse particles can be removed. In a case where the diameter of particles to be removed is equal to or greater than 1 nm, the filtering efficiency is improved.

The diameter of particles to be removed means the minimum size of particles that can be removed by the filter. For example, in a case where the diameter of particles to be removed by the filter is 20 nm, the filter can remove particles having a diameter equal to or greater than 20 nm.

Examples of the material of the aforementioned filter include 6-nylon, 6,6-nylon, polyethylene, polypropylene, polystyrene, polyimide, polyamide imide, a fluororesin, and the like.

The polyimide and/or polyamide imide may have at least one group selected from the group consisting of a carboxy group, a salt-type carboxy group, and a —NH— bond. A fluororesin, polyimide and/or polyamide imide have excellent solvent resistance.

A filter unit may be constituted with a plurality of filters described above. That is, the filter unit may further comprise a filter for removing particles having a diameter equal to or greater than 50 nm (for example, a microfiltration membrane for removing fine particles having a pore size equal to or greater than 50 nm). In a case where fine particles are present in the substance to be purified in addition to the colloidized impurity, particularly, the colloidized impurity containing metal atoms such as iron or aluminum, by filtering the substance to be purified by using a filter for removing particles having a diameter equal to or greater than 50 nm (for example, a microfiltration membrane for removing fine particles having a pore size equal to or greater than 50 nm) before filtering the substance to be purified by using a filter for removing particles having a diameter equal to or smaller than 20 nm (for example, a microfiltration membrane having a pore size equal to or smaller than 20 nm), the filtering efficiency of the filter for removing particles having a diameter equal to or smaller than 20 nm (for example, a microfiltration membrane having a pore size equal to or smaller than 20 nm) is improved, and the coarse particle removing performance is further improved.

••Metal Ion Removing Step

It is preferable that the filtering step further includes a metal ion removing step.

As the metal ion removing step, a step of passing the substance to be purified through a metal ion adsorption filter is preferable. The method for passing the substance to be purified through the metal ion adsorption filter is not particularly limited, and examples thereof include a method for disposing a metal ion adsorption filter unit comprising a metal ion adsorption filter and a filter housing in the middle of a transfer pipe line transferring the substance to be purified and passing the substance to be purified through the metal ion adsorption filter unit with or without applying pressure thereto.

The metal ion adsorption filter is not particularly limited, and examples thereof include known metal ion adsorption filters.

The metal ion adsorption filter is preferably a filter which can perform ion exchange. Herein, the metal ions to be adsorbed are not particularly limited. However, at least one kind of metal ion selected from the group consisting of Fe, Cr, Ni, and Pb is preferable, and all the metal ions of Fe, Cr, Ni, and Pb are preferable, because these readily become the cause of a defect in a semiconductor device.

From the viewpoint of improving the metal ion adsorption performance, it is preferable that the metal ion adsorption filter has an acid group on the surface thereof. Examples of the acid group include a sulfo group, a carboxy group, and the like.

Examples of the base material (material) constituting the metal ion adsorption filter include cellulose, diatomite, nylon, polyethylene, polypropylene, polystyrene, a fluororesin, and the like.

The metal ion adsorption filter may be constituted with material including polyimide and/or polyamide imide. Examples of the metal ion adsorption filter include the polyimide and/or polyamide imide porous membrane described in JP2016-155121A.

The polyimide and/or polyamide imide porous membrane may contain at least one group selected from the group consisting of a carboxy group, a salt-type carboxy group, and a —NH-bond. In a case where the metal ion adsorption filter is formed of a fluororesin, polyimide, and/or polyamide imide, the filter has further improved solvent resistance.

••Organic Impurity Removing Step

It is preferable that the filtering step includes an organic impurity removing step. As the organic impurity removing step, a step of passing the substance to be purified through an organic impurity adsorption filter is preferable. The method for passing the substance to be purified through the organic impurity adsorption filter is not particularly limited, and examples thereof include a method for disposing a filter unit comprising an organic impurity adsorption filter and a filter housing in the middle of a transfer pipe line transferring the substance to be purified and passing the organic solvent through the filter unit with or without applying pressure thereto.

The organic impurity adsorption filter is not particularly limited, and examples thereof include known organic impurity adsorption filters.

In view of improving the organic impurity adsorption performance, it is preferable that the organic impurity adsorption filter has the skeleton of an organic substance, which can interact with the organic impurity, on the surface thereof (in other words, it is preferable that the surface of the organic impurity adsorption filter is modified with the skeleton of an organic substance which can interact with the organic impurity). Examples of the skeleton of an organic substance which can interact with the organic impurity include a chemical structure which can react with the organic impurity so as to make the organic impurity trapped in the organic impurity adsorption filter. More specifically, in a case where the organic impurity contains long-chain n-alkyl alcohol (structural isomer in a case where long-chain 1-alkyl alcohol is used as an organic solvent), examples of the skeleton of an organic substance include an alkyl group. Furthermore, in a case where the organic impurity includes dibutylhydroxytoluene (BHT), examples of the skeleton of an organic substance include a phenyl group.

Examples of the base material (material) constituting the organic impurity adsorption filter include cellulose supporting active carbon, diatomite, nylon, polyethylene, polypropylene, polystyrene, a fluororesin, and the like.

Furthermore, as the organic impurity adsorption filter, it is possible to use the filters obtained by fixing active carbon to non-woven cloth that are described in JP2002-273123A and JP2013-150979A.

For the organic impurity adsorption filter, in addition to the chemical adsorption described above (adsorption using the organic impurity adsorption filter having the skeleton of an organic substance, which can interact with the organic impurity, on the surface thereof), a physical adsorption method can be used.

For example, in a case where the organic impurity contains BHT, the structure of BHT is larger than 10 Å (=1 nm). Accordingly, in a case where an organic impurity adsorption filter having a pore size of 1 nm is used, BHT cannot pass through the pore of the filter. That is, by being physically trapped by the filter, BHT is removed from the substance to be purified. In this way, for removing an organic impurity, not only a chemical interaction but also a physical removing method can be used. Here, in this case, a filter having a pore size equal to or greater than 3 nm is used as "particle removing filter", and a filter having a pore size less than 3 nm is used as "organic impurity adsorption filter".

In the present specification, 1 Å (angstrom) equals 0.1 nm.

••Ion Exchange Step

The filtering step may further include an ion exchange step.

As the ion exchange step, a step of passing the substance to be purified through an ion exchange unit is preferable. The method for passing the substance to be purified through the ion exchange unit is not particularly limited, and examples thereof include a method for disposing an ion exchange unit in the middle of a transfer pipe line transferring the substance to be purified and passing the organic solvent through the ion exchange unit with or without applying pressure thereto.

As the ion exchange unit, known ion exchange units can be used without particular limitation. Examples of the ion exchange unit include an ion exchange unit including a tower-like container storing an ion exchange resin, an ion adsorption membrane, and the like.

Examples of an aspect of the ion exchange step include a step in which a cation exchange resin or an anion exchange resin provided as a single bed is used as an ion exchange resin, a step in which a cation exchange resin and an anion exchange resin provided as a dual bed are used as an ion exchange resin, and a step in which a cation exchange resin and an anion exchange resin provided as a mixed bed are used as an ion exchange resin.

In order to reduce the amount of moisture eluted from the ion exchange resin, as the ion exchange resin, it is preferable to use a dry resin which does not contain moisture as far as possible. As the dry resin, commercial products can be used, and examples thereof include 15JS-HG·DRY (trade name, dry cation exchange resin, moisture: equal to or smaller than 2%) and MSPS2-1DRY (trade name, mixed bed resin, moisture: equal to or smaller than 10%) manufactured by ORGANO CORPORATION, and the like.

It is preferable that the ion exchange step is performed before the distillation step described above or before a moisture adjustment step which will be described later.

As another aspect of the ion exchange step, a step of using an ion adsorption membrane can be exemplified.

In a case where the ion adsorption membrane is used, a treatment can be performed at a high flow rate. The ion adsorption membrane is not particularly limited, and examples thereof include NEOSEPTA (trade name, manufactured by ASTOM Corporation), and the like.

It is preferable that the ion exchange step is performed after the distillation step described above. In a case where the ion exchange step is performed, it is possible to remove the impurities accumulated in the purification device in a case where the impurities leak or to remove substances eluted from a pipe made of stainless steel (SUS) or the like used as a transfer pipe line.

•Moisture Adjustment Step

The moisture adjustment step is a step of adjusting the content of water contained in the substance to be purified. The method for adjusting the content of water is not particularly limited, and examples thereof include method for adding water to the substance to be purified and a method for removing water from the substance to be purified.

As the method for removing water, known dehydration methods can be used without particular limitation.

Examples of the method for removing water include a dehydration membrane, a water adsorbent insoluble in an organic solvent, an aeration purging device using dried inert gas, a heating device, a vacuum heating device, and the like.

In a case where the dehydration membrane is used, membrane dehydration by pervaporation (PV) or vapor permeation (VP) is performed. The dehydration membrane is constituted as a permeable membrane module, for example. As the dehydration membrane, it is possible to use a membrane formed of a polymeric material such as a polyimide-based material, a cellulose-based material, and a polyvinyl alcohol-based material or an inorganic material such as zeolite.

The water adsorbent is used by being added to the substance to be purified. Examples of the water adsorbent include zeolite, diphosphorus pentoxide, silica gel, calcium chloride, sodium sulfate, magnesium sulfate, anhydrous zinc chloride, fuming sulfuric acid, soda lime, and the like.

In a case where zeolite (particularly, MOLECULAR SIEVE (trade name) manufactured by Union Showa K. K.) is used in the dehydration treatment, olefins can also be removed.

The component adjustment step described above is preferably performed under a sealed condition in an inert gas atmosphere in which water is less likely to be mixed into the substance to be purified.

Furthermore, in order to inhibit the mixing of moisture as much as possible, each of the treatments is preferably performed in an inert gas atmosphere in which a dew-point temperature is equal to or lower than −70° C. This is because in the inert gas atmosphere at a temperature equal to or lower than −70° C., the concentration of moisture in a gas phase is equal to or lower than 2 mass ppm, and hence the likelihood that moisture will be mixed into the organic solvent is reduced.

The manufacturing method of a chemical liquid may include, in addition to the above steps, the adsorptive purification treatment step for metal components using silicon carbide described in WO2012/043496A.

It is preferable that the filtering step described above is performed before each of the above steps, although the present invention is not particularly limited to this aspect. In a case where the filtering step is performed as above, the obtained effects of the present invention become more apparent. The filtering step is referred to as pre-filtering in some cases.

<Other Steps>

As long as the effects of the present invention are exhibited, the manufacturing method of a chemical liquid may include other steps in addition to the organic solvent preparation step and the purification step. Those other steps are not particularly limited, and examples thereof include an electricity removing step.

(Electricity Removing Step)

The electricity removing step is a step of removing electricity from the substance to be purified such that the charge potential of the substance to be purified is reduced.

As the electricity removing method, known electricity removing methods can be used without particular limitation. Examples of the electricity removing method include a method for bringing the substance to be purified into contact with a conductive material.

The contact time for which the substance to be purified is brought into contact with a conductive material is preferably 0.001 to 60 seconds, more preferably 0.001 to 1 second, and even more preferably 0.01 to 0.1 seconds. Examples of the conductive material include stainless steel, gold, platinum, diamond, glassy carbon, and the like.

Examples of the method for bringing the substance to be purified into contact with a conductive material include a method for disposing a grounded mesh formed of a conductive material in the interior of a pipe line and passing the substance to be purified through the mesh, and the like.

It is preferable that the electricity removing step is performed before at least one step selected from the group consisting of the preparation step and the purification step.

[Use of Chemical Liquid]

The use of the chemical liquid is not particularly limited.

Regarding the use of the chemical liquid, it is preferable that the chemical liquid is used in a semiconductor device manufacturing process. The chemical liquid can be used in any step for manufacturing a semiconductor device. Specifically, examples of the use of the chemical liquid include a prewet solution with which a substrate is coated before a step of forming a resist film by using a photoresist composition so as to ameliorate the coating properties of the composition, a developer for developing an exposed resist film formed of a photoresist composition, and a rinse solution for washing a developed film. Furthermore, the chemical liquid can be used as a diluent of resist materials contained in a photoresist composition.

Furthermore, the chemical liquid can be suitably used for uses other than the manufacturing of a semiconductor. The chemical liquid can be used as a developer and/or rinse solution for polyimide, a resist for a sensor, a resist for a lens, and the like.

In addition, the chemical liquid can be used as a solvent for medical uses or for washing. Particularly, the chemical liquid can be suitably used for washing a container, a pipe, or a substrate (for example, a wafer, glass, or the like).

<Container>

The chemical liquid may be temporarily stored in a container until the chemical liquid is used. As the container for storing the chemical liquid, known containers can be used without particular limitation.

As the container storing the chemical liquid, a container for a semiconductor is preferable which has a high internal cleanliness and hardly causes elution of impurities.

Examples of the usable container specifically include a "CLEAN BOTTLE" series manufactured by AICELLO CORPORATION, "PURE BOTTLE" manufactured by KODAMA PLASTICS Co., Ltd., and the like, but the container is not limited to these. It is preferable that the liquid contact portion of the container is formed of a nonmetallic material.

Examples of the nonmetallic material include the materials exemplified above as nonmetallic materials used in the liquid contact portion of the distillation column.

Particularly, in a case where a container in which the liquid contact portion is formed of a fluororesin among the above materials is used, the occurrence of a problem such as elution of an ethylene or propylene oligomer can be further inhibited than in a case where a container in which the liquid contact portion is formed of a polyethylene resin, a polypropylene resin, or a polyethylene-polypropylene resin is used.

Specific examples of the container in which the liquid contact portion is formed of a fluororesin include FluoroPure PFA composite drum manufactured by Entegris, Inc., and the like. Furthermore, it is possible to use the containers described on p. 4 in JP1991-502677A (JP-H03-502677A), p. 3 in WO2004/016526A, p. 9 and p. 16 in WO99/046309A, and the like. In a case where the nonmetallic material is used for the liquid contact portion, it is preferable to inhibit the elution of the nonmetallic material into the chemical liquid.

For the liquid contact portion of the container, in addition to the aforementioned nonmetallic material, quartz or a metallic material (more preferably an electropolished metallic material, in other words, a metallic material finished up with electropolishing) is also preferably used. The aspect of the electropolished metallic material is as described above.

It is preferable that the interior of the aforementioned container is washed before the solution is stored into the container. As a liquid used for washing, the chemical liquid itself or a liquid obtained by diluting the chemical liquid is preferable. After being manufactured, the chemical liquid may be bottled using a container such as a gallon bottle or a quart bottle, transported, and stored. The gallon bottle may be formed of a glass material or other materials.

In order to prevent the change of the components in the solution during storage, purging may be performed in the interior of the container by using an inert gas (nitrogen, argon, or the like) having a purity equal to or higher than 99.99995% by volume. Particularly, a gas with small moisture content is preferable. The temperature at the time of transport and storage may be room temperature. However, in order to prevent alteration, the temperature may be controlled within a range of −20° C. to 30° C.

(Clean Room)

It is preferable that all of the manufacturing of the chemical liquid, the opening and/or washing of the container, the handling including storage of the solution, the treatment and analysis, and the measurement are performed in a clean room. It is preferable that the clean room meets the 14644-1 clean room standard. The clean room preferably meets any of International Organization for Standardization (ISO) class 1, ISO class 2, ISO class 3, or ISO class 4, more preferably meets ISO class 1 or ISO class 2, and even more preferably meets ISO class 1.

[Chemical Liquid Storage Body]

The chemical liquid storage body according to the embodiment of the present invention comprises a storage tank and a chemical liquid stored in the storage tank, in which a liquid contact portion which contacts (or is likely to contact) the chemical liquid in the storage tank is formed of a nonmetallic material or electropolished stainless steel.

In the present specification, the storage tank means a tank which is installed in a place (a manufacturing site, a business office, and the like) where the chemical liquid is used, connected to a tank lorry which will be described later through a connection member which will be described later, and receives the chemical liquid.

In an aspect of the storage tank, the storage tank has, for example, a hollow tank body which can store the chemical liquid in the interior thereof, a chemical liquid inlet provided in the tank body, and a chemical liquid outlet provided in the tank body.

In the storage tank according to the chemical liquid storage body, a liquid contact portion (for example, the interior wall of the storage tank, the interior wall of the chemical liquid inlet, the interior wall of the chemical liquid outlet, or the like) contacting the chemical liquid is formed of a nonmetallic material or electropolished stainless steel.

In the chemical liquid storage body having the storage tank, even though a long period of time elapses after the storage of the chemical liquid, the content of the metal impurity in the chemical liquid stored in the interior of the chemical liquid storage body hardly changes.

Examples of the nonmetallic material include the materials exemplified above as the nonmetallic material used in the liquid contact portion of the distillation column.

Examples of the electropolished stainless steel include the stainless steels exemplified above that are used in the liquid contact portion of the distillation column.

Examples of the method for electropolishing the stainless steel include methods for electropolishing the metallic material described above.

As the method for forming the liquid contact portion by using a nonmetallic material or electropolished stainless steel, known methods can be used without particular limitation. Examples of the method for forming the liquid contact portion by using a nonmetallic material include a method for coating the liquid contact portion of the storage tank formed of a metallic material (for example, stainless steel) with the nonmetallic material, a method for forming the storage tank by using the nonmetallic material, and the like.

Examples of the method for forming the liquid contact portion of the storage tank by using electropolished stainless steel include a method for electropolishing the liquid contact portion of the storage tank formed of stainless steel, and the like.

In a case where the liquid contact portion of the storage tank formed of stainless steel is electropolished, buffing may be performed before the electropolishing. The buffing method is as described above.

As the manufacturing method of a chemical liquid storage body, known manufacturing methods can be used without particular limitation. Examples of the manufacturing method of a chemical liquid storage body include a method for connecting a tank (referred to as "in-vehicle tank" in this paragraph), which is loaded on a tank lorry that will be described later and stores the chemical liquid, to the storage tank through a connection member (first connection member which will be described later) and transferring the chemical liquid in the in-vehicle tank to the storage tank through the connection member such that the chemical liquid is stored in the storage tank.

In an aspect of the chemical liquid storage body, the ratio (hereinafter, referred to as "void volume") of a headspace portion in the container to the internal volume of the container is preferably 0.01% to 50% by volume, more preferably 0.5% to 30% by volume, and even more preferably 1.0% to 10% by volume. In a case where the void volume is equal to or smaller than 50% by volume, it is possible to reduce the likelihood that the impurities in the gas occupying the headspace portion may be mixed into the chemical liquid stored in the container.

In the present specification, the headspace portion in the container means a portion not storing the chemical liquid in the space which can store the chemical liquid in the container.

The headspace portion may be purged with inert gas (nitrogen, argon, or the like) having a purity equal to or higher than 99.99995% by volume. Although the inert gas is not particularly limited, it is preferable that the content of water (water vapor) in the inert gas is small. In a case where the headspace portion is purged with inert gas, even though the chemical liquid storage body is stored for a long period of time, the change of the components of the chemical liquid is further inhibited.

Furthermore, in a case where the chemical liquid storage body is transported and/or stored, the temperature of the chemical liquid storage body may be controlled within a range of −20° C. to 30° C. In a case where the temperature of the chemical liquid storage body is controlled within the above range, the change of the components of the chemical liquid stored in the chemical liquid storage body is further inhibited.

As the inert gas, a high-purity gas containing few particles is preferable. In such a gas, for example, the number of particles having a diameter equal to or greater than 0.5 μm is preferably equal to or smaller than 10/L (liter), and more preferably equal to or smaller than 1/L.

[Chemical Liquid Filling Method]

The chemical liquid filling method according to an embodiment of the present invention is a method for filling a storage tank with a chemical liquid by transferring the chemical liquid from a tank lorry comprising a tank (hereinafter, referred to as "in-vehicle tank" as well) storing the chemical liquid. The method includes the following steps in the following order.

(1) Connection step: step of connecting in-vehicle tank and storage tank to each other through first connection member (2) First transferring and filling step: step of transferring chemical liquid in in-vehicle tank to storage tank through first connection member such that storage tank is filled with the chemical liquid Hereinafter, each of the steps will be specifically described with reference to FIG. 1 (FIG. 1 is a schematic view showing an aspect of a method for filling a storage tank with a chemical liquid by transferring the chemical liquid to the storage tank from a tank lorry).

<Connection Step>

The connection step is a step of connecting the in-vehicle tank of the tank lorry and the storage tank to each other through the first connection member. As the method for connecting the in-vehicle tank and the storage tank to each other through the first connection member, known connection methods can be used without particular limitation.

Hereinafter, an aspect of the aforementioned connection method will be described using FIG. 1.

FIG. 1 is a schematic view showing an aspect of a method for connecting an in-vehicle tank 101 of a tank lorry 100 and a storage tank 102 to each other through a first connection member 103.

The in-vehicle tank 101 comprises a chemical liquid outlet not shown in the drawing. The chemical liquid outlet is connected to a lorry joint nozzle 105, and a valve 104 is disposed in the middle of the nozzle 105. The lorry joint nozzle 105 is connected to a flange joint 107 through a joint instrument 106. The other side of the flange joint 107 is connected to a pipe line 109. A valve 108 is disposed in the middle of the pipe line 109. The pipe line 109 is connected to a chemical liquid inlet (not shown in the drawing) that the storage tank 102 comprises.

A packing ring such as an O-ring may be put on the flange joint 107.

The connection step may be performed in a clean room or a clean booth so as to prevent impurities from being mixed into the chemical liquid from the connection member.

FIG. 1 shows an aspect in which the first connection member 103 includes the valve 104, the lorry joint nozzle 105, the joint instrument 106, the flange joint 107, the valve 108, and the pipe line 109. However, the constitution of the first connection member is not limited to this constitution as long as the in-vehicle tank and the storage tank can be connected to each other.

As the material of the first connection member 103, known materials can be used without particular limitation.

In view of making it more difficult for the metal impurity containing metal atoms and the organic impurity to be eluted to the chemical liquid from the first connection member 103, it is preferable that the first connection member has the following characteristics.

Condition 1: under the condition in which a ratio of a mass (g) of the first connection member to a volume (mL) of the chemical liquid transferred to and filled into the storage tank becomes 10% (g/mL) provided that a liquid temperature of the chemical liquid is 25° C., in a case where the first connection member is immersed for 1 week in the chemical liquid having a liquid temperature of 25° C., the total content of the metal atoms contained in the metal impurity eluted into the chemical liquid is equal to or smaller than 1.0 mass ppt.

Condition 2: under the condition in which a ratio of a mass (g) of the first connection member to a volume (mL) of the chemical liquid transferred to and filled into the storage tank becomes 10% (g/mL) provided that a liquid temperature of the chemical liquid is 25° C., in a case where the first connection member is immersed for 1 week in the chemical liquid having a liquid temperature of 25° C., the total content of the organic impurity eluted to the chemical liquid is equal to or smaller than 1.0 mass ppt.

The liquid contact portion, which contacts the chemical liquid, of at least one kind of constituent selected from the group consisting of the in-vehicle tank, the storage tank, and the first connection member is more preferably formed of a nonmetallic material or electropolished stainless steel. It is even more preferable that the in-vehicle tank, the storage tank, and the first connection member are formed of the aforementioned material.

The aspects of the nonmetallic material and the electropolished stainless steel are as described above.

In a case where the liquid contact portion of each of the in-vehicle tank, the storage tank, and the first connection member is formed of the aforementioned material, in a first transferring and filling step which will be described later, it is more difficult for the metal impurity containing metal atoms and the organic impurity to be mixed into the chemical liquid.

<First Transferring and Filling Step>

The first transferring and filling step is a step of transferring the chemical liquid in the in-vehicle tank to the storage tank through the first connection member such that the storage tank is filled with the chemical liquid. As the transferring and filling method, known filling methods can be used without particular limitation.

<Optional Steps>

As long as the effects of the present invention are exhibited, the chemical liquid filling method may further include optional steps in addition to the aforementioned steps. Examples of the optional steps include the following steps.

(3) Second transferring and filling step: step of transferring chemical liquid transferred to storage tank to supply tank through second connection member such that supply tank is filled with chemical liquid (4) Third transferring and filling step: step of transferring chemical liquid transferred to supply tank to device through third connection member such that device is filled with chemical liquid Hereinafter, each of the steps will be described.

(Second Transferring and Filling Step)

The second transferring and filling step is a step of transferring the chemical liquid filled into the storage tank to a supply tank, which is connected to the storage tank through a second connection member, through the second connection member such that the supply tank is filled with the chemical liquid.

In the present specification, the supply tank means a tank (feeding tank) which is installed in a place where the chemical liquid is used, does not receive the chemical liquid from the tank lorry described above, and has a function of supplying the chemical liquid into a device which will be described later.

As the supply tank, known supply tanks can be used without particular limitation. In an aspect, the supply tank includes, for example, a hollow tank body which can store the chemical liquid in the interior thereof, a chemical liquid inlet (connected to the storage tank) provided in the tank body, and a chemical liquid outlet (connected to a device which will be described later) provided in the tank body.

In the supply tank according to the chemical liquid storage body, the liquid contact portion (for example, the interior wall of the supply tank, the interior wall of the chemical liquid inlet, the interior wall of the chemical liquid outlet, or the like) contacting the chemical liquid is preferably formed of a nonmetallic material or electropolished stainless steel. The aspects of the nonmetallic material and the electropolished stainless steel are as described above.

As the method for connecting the supply tank and the storage tank to each other through the second connection member, known connection methods can be used without particular limitation.

Hereinafter, an aspect of the aforementioned connection method will be described using FIG. 2.

Figure 2:
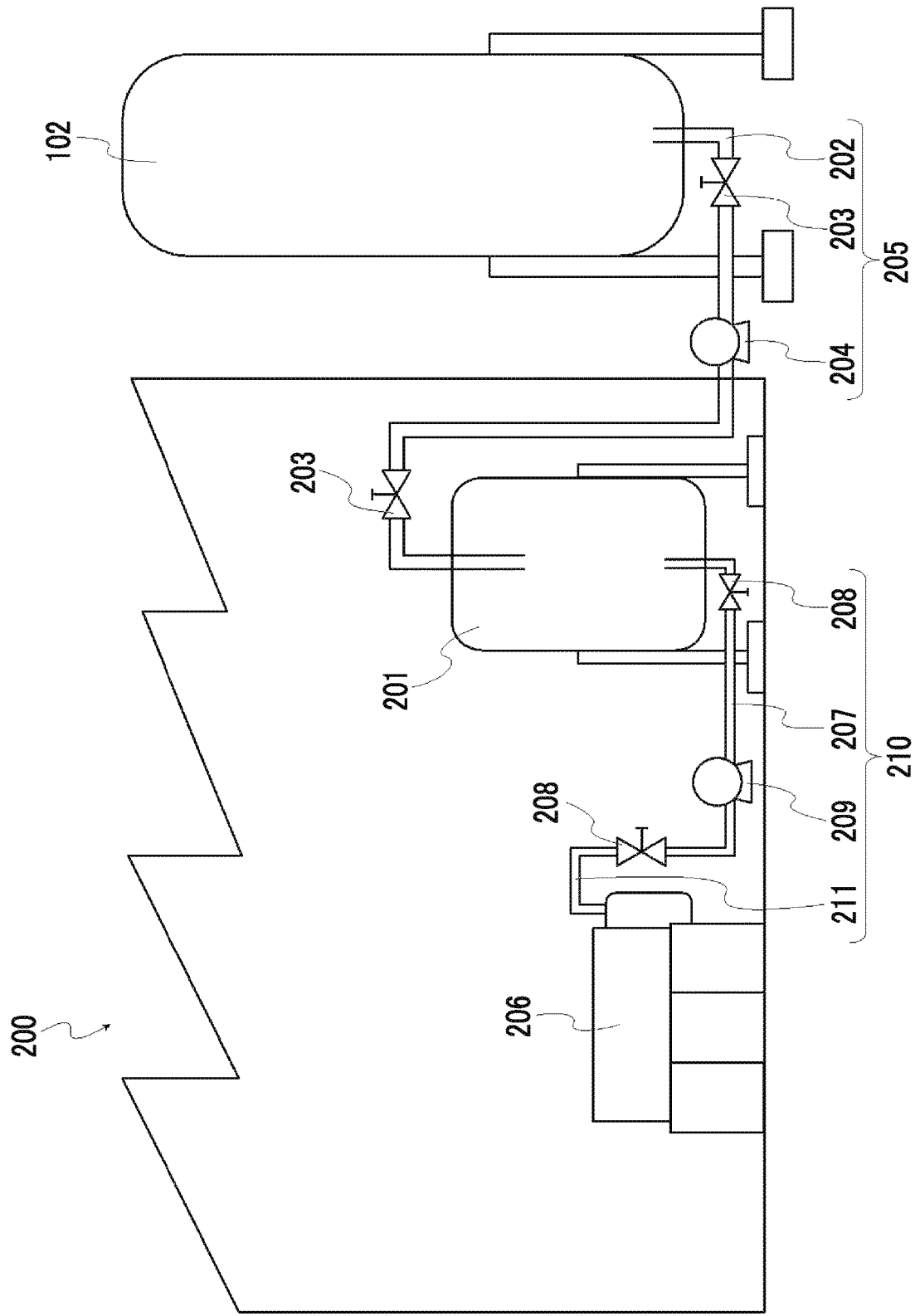
FIG. 2 is a schematic view showing an aspect of a method for filling a supply tank with a chemical liquid by transferring the chemical liquid to the supply tank from a storage tank and a method for filling a device with the chemical liquid by transferring the chemical liquid to the device from the supply tank.

FIG. 2 is a schematic view showing an aspect of a method for filling a supply tank 201 with the chemical liquid by transferring the chemical liquid to the supply tank 201 from the storage tank 102 and a method for filling a device 206 (which will be described later) with the chemical liquid by transferring the chemical liquid to the device 206 from the supply tank 201.

In FIG. 2, the supply tank 201 is installed in a manufacturing building 200 and connected to the storage tank 102 through a second connection member 205.

That is, the storage tank 102 comprises a chemical liquid outlet not shown in the drawing, the chemical liquid outlet is connected to a pipe line 202, and the pipe line 202 comprises a valve 203 and a pump 204 disposed in the middle of the pipe line 202. The pipe line 202 is connected to a chemical liquid inlet (not shown in the drawing) that the supply tank 201 comprises.

FIG. 2 shows an aspect in which the second connection member 205 includes the pipe line 202, the valve 203, and the pump 204. However, as long as the storage tank and the supply tank can be connected to each other, the constitution of the second connection member 205 is not particularly limited to this constitution.

For example, an aspect may be adopted in which the second connection member 205 further includes a switching valve, and the chemical liquid is transferred to and filled into the supply tank 201 by the switching of the pipe line 202.

Furthermore, a plurality of storage tanks 102 and/or a plurality of supply tanks 201 may be connected to the second connection member 205. In this case, by switching the pipe line 202 by the switching valve, the chemical liquid can be transferred to and filled into one supply tank 201 or the plurality of supply tanks 201 from one storage tank 102 or the plurality of storage tanks 102.

As the material of the second connection member, known materials can be used without particular limitation. It is more preferable that the liquid contact portion, which contacts the chemical liquid, of the second connection member is formed of a nonmetallic material or electropolished stainless steel. The aspects of the nonmetallic material and the electropolished stainless steel are as described above.

In a case where the liquid contact portion of the second connection member is formed of the aforementioned material, it is more difficult for the metal impurity containing metal atoms and the organic impurity to be mixed into the chemical liquid in the second transferring and filling step.

In a case where the transferring and filling step according to the embodiment of the present invention includes the second transferring and filling step, it is more difficult for metal impurities to be eluted into the chemical liquid.

(Third transferring and filling step)

The third transferring and filling step is a step of transferring the chemical liquid transferred to the supply tank to a device through a third connection member such that device is filled with the chemical liquid.

In the present specification, the device means a device using the chemical liquid. The device using the chemical liquid is not particularly limited, but is preferably a semiconductor device manufacturing device using the chemical liquid as a prewet solution and/or a developer.

As the method for connecting the device and the supply tank to each other through the third connection member, known connection members can be used without particular limitation.

Hereinafter, an aspect of the aforementioned connection method will be described using FIG. 2.

FIG. 2 is a schematic view showing an aspect of a method for filling the supply tank 201 with the chemical liquid by transferring the chemical liquid to the supply tank 201 from the storage tank 102 (the method is as described above) and a method for filling the device 206 with the chemical liquid by transferring the chemical liquid to the device 206 from the supply tank 201.

In FIG. 2, the device 206 is installed in the manufacturing building 200 and connected to the supply tank 201 through a third connection member 210.

That is, the supply tank 201 comprises a chemical liquid outlet not shown in the drawing, the chemical liquid outlet is connected to a pipe line 207, and the pipe line 207 comprises a valve 208, a filter 211, and a pump 209 disposed in the middle of the pipe line 207. The pipe line 207 is connected to a chemical liquid inlet (not shown in the drawing) that the device 206 comprises.

FIG. 2 shows an aspect in which the third connection member 210 includes the pipe line 207, the valve 208, the pump 209, and the filter 211. However, as long as the supply tank and the device can be connected to each other, the constitution of the third connection member 210 is not limited to this constitution.

For example, an aspect may be adopted in which the third connection member 210 further includes a switching valve, and the chemical liquid is transferred to and filled into device 206 by the switching of the pipe line 207.

Furthermore, a plurality of supply tanks 201 and/or a plurality of devices 206 may be connected to the third connection member 210. In this case, by switching the pipe line 207 by using the switching valve, the chemical liquid can be transferred to and filled into one device 206 or the plurality of devices 206 from one supply tank 201 or the plurality of supply tanks 201.

According to the aspect in which the third connection member includes the filter 211, the chemical liquid can be transferred to and filled into the device in a state where the amount of the metal impurity and/or the organic impurity is further reduced. The aspect of the filter is as described above.

In the manufacturing method of a chemical liquid described above, it is preferable that a portion which contacts (or is likely to contact) the chemical liquid in the devices and steps (including the connection step, the filling step, the in-vehicle tank, and the storage tank) relating to manufacturing•storage•transport is washed before the manufacturing of the chemical liquid according to the embodiment of the present invention. The liquid used for washing is not particularly limited, but is preferably the chemical liquid according to the embodiment of the present invention or a liquid obtained by diluting the chemical liquid according to the embodiment of the present invention. As the liquid used for washing, it is possible to use an organic solvent which substantially does not contain particles containing metal atoms, metal ion components, organic impurities, and the like or an organic solvent in which the content of these is sufficiently reduced. The washing may be performed plural times. Furthermore, for the washing, two or more kinds of different organic solvents may be used, or a mixture thereof may be used. The washing may be circulation washing.

Whether the devices relating to manufacturing are sufficiently washed can be judged by measuring metal atoms and metal ion components contained in the liquid used for washing. The washing is performed until the content of metal atoms, which is an indicator of washing, contained in the liquid used for washing preferably becomes equal to or smaller than 10 mass ppm, more preferably becomes equal to or smaller than 0.1 mass ppm, and particularly preferably becomes equal to or smaller than 0.001 mass ppm. In a case where the washing is performed as described above, the obtained effects of the present invention become more apparent.

As the material of the third connection member, known materials can be used without particular limitation. Particularly, the liquid contact portion, which contacts the chemical liquid, of the third connection member is more preferably formed of a nonmetallic material or electropolished stainless steel. The aspects of the nonmetallic material and the electropolished stainless steel are as described above.

In a case where the liquid contact portion of the third connection member is formed of the aforementioned materials, it is more difficult for the metal impurity containing metal atoms and the organic impurity to be mixed into the chemical liquid in the third transferring and filling step.

[Chemical Liquid Storage Method]

The chemical liquid storage method according to an aspect of the present invention is a storage method for storing a chemical liquid stored in a storage tank, which includes an adjustment step of adjusting at least one item described below. It is preferable that the chemical liquid storage method includes an adjustment step of adjusting all of the following items.

Temperature of chemical liquid
Internal pressure of storage tank
Relative humidity of headspace portion in storage tank Hereinafter, the adjustment method for each of the items will be described.

<Item 1 to be Adjusted: Temperature of Chemical Liquid>

It is preferable that the adjustment step includes a step of adjusting the temperature of the chemical liquid in the storage tank.

The temperature of the chemical liquid is not particularly limited, but is preferably adjusted to be 5° C. to 50° C. in general and more preferably adjusted to be 10° C. to 30° C. According to the chemical liquid storage method having the step of adjusting the temperature of the chemical liquid to be 10° C. to 30° C., it is more difficult for the metal impurity containing metal atoms and the organic impurity to be eluted into the chemical liquid during storage.

As the method for adjusting the temperature of the chemical liquid, known methods can be used without particular limitation.

<Item 2 to be Adjusted: Internal Pressure of Storage Tank>

It is preferable that the adjustment step includes a step of adjusting the internal pressure of the storage tank.

The internal pressure of the storage tank is not particularly limited, but is preferably adjusted to be 0.05 to 1.5 MPa in general, and more preferably adjusted to be 0.1 to 1.0 MPa. According to the chemical liquid storage method having a step of adjusting the internal pressure of the storage tank to be 0.1 to 1.0 MPa, it is more difficult for the metal impurity containing metal atoms and the organic impurity to be eluted into the chemical liquid during storage.

As the method for adjusting the internal pressure of the storage tank, known methods can be used without particular limitation.

<Item 3 to be Adjusted: Relative Humidity of Headspace Portion in Storage Tank>

It is preferable that the adjustment step includes a step of adjusting the relative humidity of the headspace portion in the storage tank.

The relative humidity of the headspace portion of the storage tank is not particularly limited, but is preferably adjusted to be 5% to 95% in general, and more preferably adjusted to be 30% to 90%. According to the chemical liquid storage method having a step of adjusting the relative humidity of the headspace portion of the storage tank to be 30% to 90%, it is more difficult for the metal impurity containing metal atoms and the organic impurity to be eluted into the chemical liquid during storage.

In the present specification, the headspace portion in the storage tank means a portion which does not store the chemical liquid in the space which can store the chemical liquid in the storage tank.

As the method for adjusting the relative humidity of the headspace portion in the storage tank, known methods can be used without particular limitation.

In an aspect of the storage tank, a ratio (hereinafter, referred to as "void volume" as well) of the headspace portion in the storage tank to the internal volume of the storage tank is preferably 0.01% to 50% by volume, more preferably 0.5% to 30% by volume, and even more preferably 1.0% to 10% by volume. In a case where the void volume is equal to or smaller than 50% by volume, it is possible to reduce the likelihood that the impurities in the gas occupying the headspace portion will be mixed into the chemical liquid stored in the storage tank.

EXAMPLES

Hereinafter, the present invention will be more specifically described based on examples. The materials, the amount and proportion of the materials used, the details of treatments, the procedure of treatments, and the like shown in the following examples can be appropriately modified as long as the gist of the present invention is maintained. Accordingly, the scope of the present invention is not limited to the following examples.

[Preparation of Substance to be Purified Containing Organic Solvent]

In order to manufacture chemical liquids of examples and comparative examples, substances to be purified containing each of the following organic solvents were prepared. As each of the substances to be purified, a commercial product called "high-purity grade" containing an organic solvent in an amount equal to or greater than 99% by mass was used. The abbreviation for each organic solvent is shown in the bracket.

Butyl acetate (nBA)
Propylene glycol monomethyl ether (PGME)
Propylene glycol monoethyl ether (PGEE)
Propylene glycol monopropyl ether (PGPE)
Solvent 1: hexyl alcohol
Solvent 2: 2-heptanone
Solvent 3: isoamyl acetate
Propylene glycol monomethyl ether acetate (PGMEA)
Cyclopentanone (CyPe)
Cyclohenanone (CyHe)
γ-Butyrolactone (GBL)
2-Hydroxymethyl butyrate (HBM)
Cyclohenanone dimethyl acetal (CHdMA)
Ethyl lactate (EL)

Example 1: Preparation of Chemical Liquid 1

A substance to be purified containing butyl acetate (nBA) as an organic solvent was prepared, and a chemical liquid 1 was manufactured by the following method. The chemical liquid was manufactured using a device in which a stainless steel tank having a coating layer formed of polytetrafluoroethylene (PTFE) in a liquid contact portion was connected to a plurality of filter units through a circulation pipe line. Furthermore, a pump was disposed in the middle of the circulation pipe line. The liquid contact portion of each of the circulation pipe line and the pump was formed of polytetrafluoroethylene. Furthermore, filters disposed in the following order from the tank side were used.

First metal ion adsorption filter (15 nm IEX PTFE manufactured by Entegris, Inc. (filter made of PTFE having a pore size of 15 nm including a base material having a sulfo group on the surface thereof))
Particle removing filter (12 nm PTFE manufactured by Entegris, Inc. (filter made of PTFE having a pore size of 12 nm))
Second metal ion adsorption filter (15 nm IEX PTFE manufactured by Entegris, Inc. (filter made of PTFE having a pore size of 15 nm including a base material having a sulfo group on the surface thereof))
Organic impurity adsorption filter (special filter A (filter described in JP2013-150979A obtained by fixing active carbon to non-woven cloth))

The downstream side of the organic impurity adsorption filter was provided with moisture adjustment means containing MOLECULAR SIEVE 3A (manufactured by Union Showa K. K., dehydrating agent).

Butyl acetate (nBA) was stored in the tank and then circulated 10 times through the pipe line including the filter and the moisture adjustment means described above, thereby obtaining the chemical liquid 1.

Thereafter, the prepared chemical liquid 1 was stored in an in-vehicle tank of a tank lorry (liquid contact portion was formed of PTFE). Then, the chemical liquid 1 was stored in a storage tank through a first connection member (a lorry joint nozzle, a joint instrument, a flange joint, an O-ring, and a pipe line). A liquid contact portion of the connection member and a liquid contact portion of the storage tank were made of PTFE.

Examples 2 to 52 and Comparative Examples 1 to 10: Preparation of Chemical Liquids Chemical liquids were prepared in the same manner as in Example 1, except that substances to be purified containing each of the organic solvents described in Table 1 were used, and the liquid contact portion of the connection member and the liquid contact portion of the storage tank were formed of the materials described in Table 1. Each of the chemical liquids was stored in the storage tank. The composition of each of the chemical liquids described in Table 1 was adjusted by changing the material used, the number of times the chemical liquid passed through the filter, presence or absence of the filter, and the like.

For preparing the chemical liquids of Examples 4, 5, 29 and 30 and Comparative Examples 3, 4, 8, and 9, the organic impurity adsorption filter was not used.

For preparing the chemical liquids of Examples 17 and 44, MOLECULAR SIEVE 3A was not used.

For preparing the chemical liquids of Examples 18 and 45 and Comparative Examples 1 and 6, the particle removing filter was not used.

[Method for Measuring Content of Each Component Contained in Chemical Liquid, and the Like]

For measuring the content of each component contained in the chemical liquid stored in the storage tank, and the like, the following method was used. All of the following measurements were performed in a clean room that met the level equal to or lower than International Organization for Standardization (ISO) Class 2. In order to improve the measurement accuracy, at the time of measuring each component, in a case where the content of the component was found to be equal to or smaller than a detection limit by general measurement, the organic solvent was concentrated by 1/100 in terms of volume for performing the measurement, and the content was calculated by converting the concentration into the content of the organic solvent not yet being concentrated. The results are summarized in Table 1 and Table 2.

<Content of Organic Solvent, Organic Impurity, and Alcohol Impurity>

The content of the organic solvent, the organic impurity, and the alcohol impurity contained in the chemical liquid stored in the storage tank was measured using a gas chromatography mass spectrometer (tradename "GCMS-2020", manufactured by Shimadzu Corporation).
(Measurement condition)
Capillary column: InertCap 5MS/NP 0.25 mmI D×30 m df=0.25 μm
Sample introduction method: slit 75 kPa constant pressure
Vaporizing chamber temperature: 230° C.
Column oven temperature: 80° C. (2 min)-500° C. (13 min) heating rate 15° C./min
Carrier gas: helium
Septum purge flow rate: 5 mL/min
Split ratio: 25:1
Interface temperature: 250° C.
Ion source temperature: 200° C.
Measurement mode: Scan
Amount of sample introduced: 1 μL
<Total Content of Metal Atoms Contained in Metal Impurity and Content of Fe Atom, Cr Atom, Ni Atom, and Pb Atom>
The total content of the metal atoms contained in the metal impurity in the chemical liquid stored in the storage tank and the content of a predetermined metal atom were measured using Agilent 8800 triple quadrupole ICP-MS (for semiconductor analysis, option #200).
(Measurement condition)
As a sample introduction system, a quartz torch, a coaxial perfluoroalkoxyalkane (PFA) nebulizer (for self-suction), and a platinum interface cone were used. The measurement parameters of cool plasma conditions are as below.
Output of Radio Frequency (RF) (W): 600
Flow rate of carrier gas (L/min): 0.7
Flow rate of makeup gas (L/min): 1
Sampling depth (mm): 18
<Water>
The content of water contained in the chemical liquid stored in the storage tank was measured using a Karl Fischer moisture meter (trade name "MKC-710M", manufactured by KYOTO ELECTRONICS MANUFACTURING CO., LTD., Karl Fischer coulometric titration method).
[Physical Properties of Chemical Liquid]
The physical properties of the chemical liquid stored in the storage tank were measured or calculated by the following method.
<Mass ratio of total content of component having boiling point equal to or higher than 250° C. to total content of component having boiling point lower than 250° C.>
The mass ratio of the total content of the component having a boiling point equal to or higher than 250° C. to the total content of the component having a boiling point lower than 250° C. in the chemical liquid stored in the storage tank was calculated by the following equation based on the measurement results obtained from the organic solvent and the organic impurity.
(Equation) Mass ratio of total content of component having boiling point equal to or higher than 250° C. to total content of component having boiling point lower than 250° C.=$S_H/S_O$ In the above equation, $S_H$ represents the total content (mass ppm) of the component having a boiling point equal to or higher than 250° C. in the chemical liquid, and $S_O$ represents the total content (mass ppm) of the component having a boiling point lower than 250° C. in the chemical liquid.
<Number of Coarse Particles>
The number of coarse particles contained in the chemical liquid stored in the storage tank was measured by the following method.

First, the chemical liquid stored in the storage tank was left to stand for 1 day at room temperature after storage. By using a light scattering-type liquid-borne particle counter (manufactured by RION Co., Ltd., model number: KS-18F, light source: semiconductor laser-excited solid-state laser (wavelength: 532 nm, rated power: 500 mW), flow rate: 10 mL/min, the measurement principle is based on a dynamic light scattering method), the number of particles having a size equal to or greater than 100 nm contained in 1 mL of the chemical liquid having been left to stand was counted 5 times, and the average thereof was adopted as the number of coarse particles.

The light scattering-type liquid-borne particle counter was used after being calibrated using a Polystyrene Latex (PSL) standard particle solution.
[Evaluation]
The chemical liquid stored in the storage tank was evaluated by the following method. All of the following evaluation tests were performed in a clean room that met the level equal to or lower than International Organization for Standardization (ISO) Class 2.
<Elution Test: First Connection Member>
First, the total content of the organic impurity contained in each of the chemical liquids described in Table 1 and Table 2 and the total content of metal atoms in the metal impurity were measured. The measurement method is as described above.

Then, under the condition in which the ratio of the mass of the first connection member to the volume of the chemical liquid having a liquid temperature of 25° C. corresponding to each of the examples and the comparative examples became 10% (g/mL), each of the first connection members described in Tables 1 and 2 was immersed for 1 week in the chemical liquid having a liquid temperature of 25° C. corresponding to each of the examples and the comparative examples. Thereafter, the first connection member was pulled up from each of the chemical liquids, and for each of the chemical liquids used for immersion, the total content of the organic impurity and the total content of the metal atoms in the metal impurity were measured by the same method as described above.

Subsequently, the increase in the total content of the organic impurity before and after the immersion and the increase in the total content of the metal atoms before and after the immersion were calculated and adopted as an elution amount. The results are shown in Tables 1 and 2.
<Elution Test: Storage Tank>
First, the total content of the metal atoms in the metal impurity contained in each of the chemical liquids described in Tables 1 and 2 was measured. The measurement method is as described above.

Then, a test piece having a size of 2 cm (length)×2 cm (width)×0.5 cm (thickness) made of the material of the liquid contact portion of each of the storage tanks shown in Table 1 and Table 2 was cut, immersed in the chemical liquid having a liquid temperature of 25° C. of each of the examples, and left to stand for 1 week in a thermostat in a state of being kept at 25° C. Thereafter, the test piece was taken out, and the total content of the metal atoms in the metal impurity contained in the chemical liquid used for immersion was measured.

Subsequently, the increase (unit: mass ppt) in the total content of the metal atoms in the chemical liquid before and after the immersion was calculated and adopted the result of an elution test. The results are shown in Tables 1 and 2.
<Temporal Change of Total Content of Metal Atoms in Chemical Liquid Stored in Storage Tank>

Each of the chemical liquids stored in the storage tank was stored for 300 days at room temperature. At points in time when 100 days, 200 days, and 300 days elapsed from the start of the storage, a portion of each of the chemical liquids was extracted as a sample from the storage tank, and by using Agilent 8800 ICP-MS, the total content of the metal atoms contained in the metal impurity in the chemical liquid was measured. The results are shown in Table 1.

<Temporal stability of chemical liquid stored in storage tank>

Each of the chemical liquids stored in the storage tank was stored for 300 days at room temperature. Then, a portion of each of the chemical liquids was extracted as a sample from the storage tank, and by GCMS (the measurement method is the same as described above), the content of the organic solvent contained in the chemical liquid was measured.

The measured content was compared with the content of the organic solvent contained in each of the chemical liquids just stored in the storage tank, and the change (% by mass, an absolute value) in the content was measured.

The results were evaluated by the following method and shown in Table 1.

A: the change of the content of the organic solvent contained in the chemical liquid was 0% to 1% by mass.

B: the change of the content of the organic solvent contained in the chemical liquid was 1% to 5% by mass.

C: the change of the content of the organic solvent contained in the chemical liquid was greater than 5% by mass.

<Evaluation of developability and defect inhibition performance (developer)>

The developability and the defect inhibition performance demonstrated in a case where the chemical liquids of Examples 1 to 25 and Comparative Examples 1 to 5 were used as a developer were evaluated.

First, a silicon wafer was coated with ARC29A (manufactured by NISSAN CHEMICAL INDUSTRIES, LTD.) as a composition for forming an organic antireflection film, and the coating film was baked for 60 seconds at 205° C., thereby forming a 78 nm antireflection film.

Then, by using a spin coater, the antireflection film was coated with FAiRS-9101A12 (ArF positive resist composition manufactured by FUJIFILM Electronic Materials Co., Ltd.) and baked for 60 seconds at 100° C., thereby forming a resist film having a film thickness of 150 nm.

By using an ArF excimer laser scanner (NA 0.75), the obtained wafer was exposed at 25 mJ/cm2 and then heated for 60 seconds at 120° C.

Thereafter, by using each of the chemical liquids shown in Table 1, the wafer was developed (negative development) for 30 seconds and rinsed for 30 seconds by using 4-methyl-2-pentanol (MIBC), thereby obtaining a pattern having a pitch of 200 nm and a line width of 100 nm.

(Defect Inhibition Performance)

By using a pattern defect device (for example, a MULTIPURPOSE Scanning Electron Microscope (SEM) Inspago RS6000 series manufactured by Hitachi-High Technologies Corporation), the number of defects on the pattern of the wafer on which the resist pattern was formed was measured. The results were evaluated based on the following standards. The results are shown in Table 1.

Evaluation Standards

AA: the number of defects was equal to or smaller than 20.

A: the number of defects was greater than 20 and equal to or smaller than 50.

B: the number of defects was greater than 50 and equal to or smaller than 100.

C: the number of defects was greater than 100 and equal to or smaller than 150.

D: the number of defects was greater than 150.

(Developability)

By using a Scanning Electron Microscope (SEM), whether or not a residue was in a region (unexposed portion), which was not irradiated with light in the step of exposing the wafer on which the resist pattern was formed, was measured. The results were evaluated based on the following standards. The results are shown in Table 1.

Evaluation Standards

A: no residue was confirmed in the unexposed portion.

B: a few residues were confirmed in the unexposed portion, but the residues were unproblematic for practical use.

C: residues were confirmed in the unexposed portion, but the residues were acceptable for practical use.

D: residues were clearly confirmed in the unexposed portion.

<Evaluation of Developability and Defect Inhibition Performance (Prewet Solution)>

The developability and the defect inhibition performance demonstrated in a case where the chemical liquids of Examples 26 to 52 and Comparative Examples 6 to 10 were used as a prewet solution were evaluated.

First, the prewet solution (each of the chemical liquids shown in Table 2) was added dropwise to the surface of a silicon wafer, and the wafer was spin-coated with the solution.

Then, the silicon wafer was coated with ARC29SR (manufactured by NISSAN CHEMICAL INDUSTRIES, LTD.) as a composition for forming an organic antireflection film, and the coating film was baked for 60 seconds at 205° C., thereby forming an antireflection film having a film thickness of 95 nm.

Thereafter, the obtained antireflection film was coated with FAiRS-9101A12 (ArF positive resist composition manufactured by FUJIFILM Electronic Materials Co., Ltd.) and baked (PB: Prebake) for 60 seconds at 100° C., thereby forming a resist film having a film thickness of 90 nm.

By using an ArF excimer laser immersion scanner (manufactured by ASML; XT1700i, NA1.20, Dipole (outer cy: 0.981/inner cy: 0.895), Y-polarized), the obtained wafer was pattern-wise exposed through a halftone mask. As an immersion liquid, ultrapure water was used. Then, the wafer was heated for 60 seconds at 105° C. (PEB: Post Exposure Bake). Thereafter, the wafer was subjected to puddle development for 30 seconds by using a negative developer. Subsequently, the wafer was rotated for 30 seconds at a rotation speed of 4,000 rpm, thereby forming a negative resist pattern. The developability and the defect inhibition performance of the obtained resist pattern were evaluated by the method described above. The results are shown in Table 2.

Regarding the content of the organic solvent, "balance" means the content of the organic solvent obtained by subtracting the content of the organic impurity and the content of the metal impurity from the total mass of the chemical liquid. In all of the examples and the comparative examples, the content of the organic solvent was equal to or greater than 98% by mass.

Regarding the details of the organic impurity in Comparative Example 3, the content of n-butanol was 1,500 mass ppm, the content of acetic acid was 1,200 mass ppm, the content of dibutyl ether was 6,200 mass ppm, and the content of isobutyl acetate was 6,100 mass ppm.

In the tables, the column of "Organic impurity" shows the total content of the organic impurity.

Furthermore, in the tables, the column of "Others" shows the metal atoms such as Na, K, Ca, Cu, Mg, Mn, Li, Al, and Sn.

The abbreviations in the tables represent the following.
(Material of Liquid Contact Portion of Storage Tank)
PTFE: the liquid contact portion was made of polytetrafluoroethylene (here, the storage tank was made of stainless steel).
PP: the liquid contact portion was made of polypropylene (here, the storage tank was made of stainless steel).
SUS (1): the liquid contact portion was made of stainless steel (not being electropolished, here, the storage tank was made of stainless steel as well).
SUS (2): the liquid contact portion was made of electropolished stainless steel (here, the storage tank was made of stainless steel)
PTFE (2): the liquid contact portion was made of polytetrafluoroethylene (here, the storage tank was made of polytetrafluoroethylene as well).
(Material of First Connection Member)
PTFE (2): the liquid contact portion was made of polytetrafluoroethylene (here, the first connection member was made of polytetrafluoroethylene as well).
PP: the liquid contact portion was made of polypropylene (here, the first connection member was made of stainless steel).
SUS (1): the liquid contact portion was made of stainless steel (not being electropolished, here, the first connection member was made of stainless steel as well).

What the abbreviations mean is also applied to each table.

Table 1 is divided into Table 1-1 to Table 1-6. The composition of the chemical liquid of each of the examples and the comparative examples, the physical properties of the chemical liquid, the material of the liquid contact portion of the storage tank and the first connection member, and the evaluation results are described in the rows of Table 1-1 to Table 1-6.

For example, regarding the composition of the chemical liquid of Example 1, it was confirmed that the total content [A] of the organic impurity was 500 mass ppm, the content [B] of the alcohol impurity in the organic impurity was 25 mass ppm, and B/A equaled 0.05. Regarding the metal atoms in the chemical liquid of Example 1, it was confirmed that the content of Fe was 2 mass ppt (0.12 with respect to the total content of the metal atoms), the content of Cr was 1 mass ppt (0.06 with respect to the total content of the metal atoms), the content of Ni was 2 mass ppt (0.12 with respect to the total content of the metal atoms), the content of Pb was 1 mass ppt (0.06 with respect to the total content of the metal atoms), the content of others was 11 mass ppt (0.65 with respect to the total content of the metal atoms), and the total content of the metal atoms was 17 mass ppt. It was confirmed that in the chemical liquid of Example 1, the water content was 0.10% by mass, and the balance was nBA.

Regarding the physical properties of the chemical liquid of Example 1, it was confirmed that the mass ratio (in the table, described as "High-boiling-point compound/low-boiling-point compound") of the total content of the component having a boiling point equal to or higher than 250° C. to the total content of the component having a boiling point lower than 250° C. was 0.00020, and the number of coarse particles was 8/ml.

It was confirmed that the material of the liquid contact portion of the storage tank storing the chemical liquid of Example 1 was "PTFE", and the material of the liquid contact portion of the first connection member used for storage was "PTFE (2)".

According to the evaluation results, it was confirmed that the amount of the metal impurity eluted from the liquid contact portion of the storage tank used for storing the chemical liquid of Example 1 was less than 1 mass ppt, the amount of the metal impurity eluted from the liquid contact portion of the first connection member used for storing the chemical liquid of Example 1 was less than 1 mass ppt, and the amount of the organic impurity eluted from the liquid contact portion of the first connection member was less than 1 mass ppt.

According to the evaluation results of the chemical liquid storage body including the storage tank storing the chemical liquid of Example 1, regarding the temporal change of the total content of the metal atoms in the chemical liquid stored in the storage tank, it was confirmed that the total content of the metal atoms was 18 mass ppt after 100 days, 18 mass ppt after 200 days, and 18 mass ppt after 300 days.

Regarding the temporal stability of the chemical liquid of Example 1 stored in the storage tank, it was confirmed that the difference between the content of the organic solvent contained in each of the chemical liquids just stored in the storage tank and the change in the content of the organic solvent after the storage for 300 days was evaluated as "A".

It was confirmed that the evaluation results of the developability and the defect inhibition performance demonstrated in a case where the chemical liquid of Example 1 was used as a developer were "A" and "AA" respectively.

Other examples and comparative examples in Table 1 can be analyzed in the same manner as described above.

Table 2 is also divided into Table 2-1 to Table 2-6. The composition of the chemical liquid of each of the examples and the comparative examples, the physical properties of the chemical liquid, the material of the liquid contact portion of the storage tank and the first connection member, and the evaluation results are described in the rows of Table 2-1 to Table 2-6.

TABLE 1

| Table 1-1 | Organic solvent | | Organic impurity | | |
|---|---|---|---|---|---|
| | Type | Content (% by mass) | Organic impurity (mass ppm) [A] | Alcohol impurity (mass ppm) [B] | [B]/[A] |
| Example 1 | nBA | Balance | 500 | 25 | 0.05 |
| Example 2 | nBA | Balance | 500 | 25 | 0.05 |
| Example 3 | nBA | Balance | 500 | 25 | 0.05 |
| Example 4 | nBA | Balance | 3000 | 25 | 0.01 |
| Example 5 | nBA | Balance | 8000 | 25 | 0.003 |

TABLE 1-continued

| Table 1-1 | Organic solvent Type | Organic solvent Content (% by mass) | Organic impurity Organic impurity (mass ppm) [A] | Organic impurity Alcohol impurity (mass ppm) [B] | [B]/[A] |
|---|---|---|---|---|---|
| Example 6 | nBA | Balance | 1000 | 25 | 0.03 |
| Example 7 | nBA | Balance | 1500 | 25 | 0.02 |
| Example 8 | Solvent 1 | Balance | 500 | 30 | 0.06 |
| Example 9 | Solvent 2 | Balance | 500 | 20 | 0.04 |
| Example 10 | Solvent 3 | Balance | 500 | 20 | 0.04 |
| Example 11 | nBA | Balance | 500 | 100 | 0.2 |
| Example 12 | nBA | Balance | 500 | 200 | 0.4 |
| Example 13 | nBA | Balance | 500 | 25 | 0.05 |
| Example 14 | nBA | Balance | 500 | 25 | 0.05 |
| Example 15 | nBA | Balance | 500 | 25 | 0.05 |
| Example 16 | nBA | Balance | 500 | 25 | 0.05 |
| Example 17 | nBA | Balance | 500 | 25 | 0.05 |
| Example 18 | nBA | Balance | 500 | 25 | 0.05 |
| Example 19 | nBA | Balance | 500 | 25 | 0.05 |
| Example 20 | nBA | Balance | 500 | 25 | 0.05 |
| Example 21 | nBA | Balance | 500 | 25 | 0.05 |
| Example 22 | nBA | Balance | 500 | 25 | 0.05 |
| Example 23 | nBA | Balance | 500 | 25 | 0.05 |
| Example 24 | nBA | Balance | 500 | 25 | 0.05 |
| Example 25 | nBA | Balance | 500 | 25 | 0.05 |
| Comparative Example 1 | nBA | Balance | 500 | 25 | 0.05 |
| Comparative Example 2 | nBA | Balance | 0.05 | 0.03 | 0.60 |
| Comparative Example 3 | nBA | Balance | 15000 | 1500 | 0.10 |
| Comparative Example 4 | nBA | Balance | 3000 | 0.1 | 0.00003 |
| Comparative Example 5 | nBA | Balance | 1500 | 1400 | 0.93 |

TABLE 2

| Table 1-2 | Metal atoms contained in metal impurity Fe Content (Mass ppt) | Fe Mass ratio (Fe/total) | Cr Content (Mass ppt) | Cr Mass ratio (Cr/total) | Ni Content (Mass ppt) | Ni Mass ratio (Ni/total) |
|---|---|---|---|---|---|---|
| Example 1 | 2 | 0.12 | 1 | 0.06 | 2 | 0.12 |
| Example 2 | 10 | 0.27 | 3 | 0.08 | 9 | 0.24 |
| Example 3 | 14 | 0.31 | 4 | 0.09 | 12 | 0.27 |
| Example 4 | 2 | 0.10 | 1 | 0.05 | 3 | 0.14 |
| Example 5 | 2 | 0.11 | 1 | 0.05 | 3 | 0.16 |
| Example 6 | 3 | 0.17 | 1 | 0.06 | 3 | 0.17 |
| Example 7 | 3 | 0.17 | 1 | 0.06 | 4 | 0.22 |
| Example 8 | 3 | 0.16 | 1 | 0.05 | 2 | 0.11 |
| Example 9 | 3 | 0.14 | 1 | 0.05 | 3 | 0.14 |
| Example 10 | 2 | 0.12 | 1 | 0.06 | 3 | 0.18 |
| Example 11 | 2 | 0.11 | 2 | 0.11 | 3 | 0.16 |
| Example 12 | 6 | 0.22 | 2 | 0.07 | 4 | 0.15 |
| Example 13 | 2 | 0.12 | 1 | 0.06 | 3 | 0.18 |
| Example 14 | 7 | 0.25 | 2 | 0.07 | 4 | 0.14 |
| Example 15 | 2 | 0.11 | 1 | 0.06 | 4 | 0.22 |
| Example 16 | 3 | 0.14 | 1 | 0.05 | 3 | 0.14 |
| Example 17 | 2 | 0.09 | 1 | 0.04 | 4 | 0.17 |
| Example 18 | 2 | 0.11 | 1 | 0.05 | 3 | 0.16 |
| Example 19 | 2 | 0.11 | 1 | 0.05 | 2 | 0.11 |
| Example 20 | 2 | 0.11 | 1 | 0.06 | 2 | 0.11 |
| Example 21 | 3 | 0.15 | 1 | 0.05 | 4 | 0.20 |
| Example 22 | 2 | 0.10 | 1 | 0.05 | 3 | 0.14 |
| Example 23 | 2 | 0.10 | 1 | 0.05 | 3 | 0.14 |
| Example 24 | 2 | 0.12 | 0.1 | 0.006 | 2 | 0.12 |
| Example 25 | 2 | 0.08 | 1 | 0.04 | 2 | 0.08 |
| Comparative Example 1 | 166 | 0.27 | 112 | 0.18 | 158 | 0.26 |
| Comparative Example 2 | 2 | 0.13 | 1 | 0.06 | 2 | 0.13 |

TABLE 2-continued

| Table 1-2 | Metal atoms contained in metal impurity | | | | | |
|---|---|---|---|---|---|---|
| | Fe | | Cr | | Ni | |
| | Content (Mass ppt) | Mass ratio (Fe/total) | Content (Mass ppt) | Mass ratio (Cr/total) | Content (Mass ppt) | Mass ratio (Ni/total) |
| Comparative Example 3 | 3 | 0.16 | 1 | 0.05 | 2 | 0.11 |
| Comparative Example 4 | 2 | 0.11 | 1 | 0.05 | 3 | 0.16 |
| Comparative Example 5 | 2 | 0.11 | 1 | 0.06 | 3 | 0.17 |

TABLE 3

| Table 1-3 | Metal atoms contained in metal impurity | | | | | Water |
|---|---|---|---|---|---|---|
| | Pb | | Others | | Total | content |
| | Content (Mass ppt) | Mass ratio (Pb/total) | Content (Mass ppt) | Mass ratio (Others/total) | (Mass ppt) | (% By mass) |
| Example 1 | 1 | 0.06 | 11 | 0.65 | 17 | 0.10% |
| Example 2 | 3 | 0.08 | 12 | 0.32 | 37 | 0.10% |
| Example 3 | 3 | 0.07 | 12 | 0.27 | 45 | 0.10% |
| Example 4 | 1 | 0.05 | 14 | 0.67 | 21 | 0.10% |
| Example 5 | 1 | 0.05 | 12 | 0.63 | 19 | 0.10% |
| Example 6 | 1 | 0.06 | 10 | 0.56 | 18 | 0.10% |
| Example 7 | 1 | 0.06 | 9 | 0.50 | 18 | 0.10% |
| Example 8 | 1 | 0.05 | 12 | 0.63 | 19 | 0.10% |
| Example 9 | 1 | 0.05 | 13 | 0.62 | 21 | 0.10% |
| Example 10 | 1 | 0.06 | 10 | 0.59 | 17 | 0.10% |
| Example 11 | 1 | 0.05 | 11 | 0.58 | 19 | 0.10% |
| Example 12 | 3 | 0.11 | 12 | 0.44 | 27 | 0.10% |
| Example 13 | 1 | 0.06 | 10 | 0.59 | 17 | 0.10% |
| Example 14 | 3 | 0.11 | 12 | 0.43 | 28 | 0.10% |
| Example 15 | 1 | 0.06 | 10 | 0.56 | 18 | 0.10% |
| Example 16 | 1 | 0.05 | 13 | 0.62 | 21 | 0.10% |
| Example 17 | 1 | 0.04 | 15 | 0.65 | 23 | 1.70% |
| Example 18 | 1 | 0.05 | 12 | 0.63 | 19 | 0.10% |
| Example 19 | 1 | 0.05 | 13 | 0.68 | 19 | 0.10% |
| Example 20 | 1 | 0.06 | 12 | 0.67 | 18 | 0.10% |
| Example 21 | 1 | 0.05 | 11 | 0.55 | 20 | 0.07% |
| Example 22 | 1 | 0.05 | 14 | 0.67 | 21 | 0.10% |
| Example 23 | 1 | 0.05 | 14 | 0.67 | 21 | 0.10% |
| Example 24 | 1 | 0.06 | 11 | 0.68 | 16 | 0.10% |
| Example 25 | 8 | 0.33 | 11 | 0.46 | 24 | 0.10% |
| Comparative Example 1 | 106 | 0.17 | 68 | 0.11 | 610 | 0.10% |
| Comparative Example 2 | 1 | 0.06 | 10 | 0.63 | 16 | 0.10% |
| Comparative Example 3 | 1 | 0.05 | 12 | 0.63 | 19 | 0.10% |
| Comparative Example 4 | 1 | 0.05 | 12 | 0.63 | 19 | 0.10% |
| Comparative Example 5 | 1 | 0.06 | 11 | 0.61 | 18 | 0.10% |

TABLE 4

| Table 1-4 | Physical properties of chemical liquid | | Material of liquid contact portion | |
|---|---|---|---|---|
| | High-boiling-point compound/low-boiling-point compound | Number of coarse particles (number/ml) | Storage tank | First connection member |
| Example 1 | 0.000020 | 8 | PTFE | PTFE (2) |
| Example 2 | 0.000020 | 15 | PTFE | PTFE (2) |

TABLE 4-continued

| Table 1-4 | Physical properties of chemical liquid | | Material of liquid contact portion | |
|---|---|---|---|---|
| | High-boiling-point compound/low-boiling-point compound | Number of coarse particles (number/ml) | Storage tank | First connection member |
| Example 3 | 0.000020 | 23 | PTFE | PTFE (2) |
| Example 4 | 0.000050 | 7 | PTFE | PTFE (2) |
| Example 5 | 0.000080 | 6 | PTFE | PTFE (2) |
| Example 6 | 0.000200 | 7 | PTFE | PTFE (2) |
| Example 7 | 0.000800 | 6 | PTFE | PTFE (2) |
| Example 8 | 0.000020 | 7 | PTFE | PTFE (2) |
| Example 9 | 0.000020 | 6 | PTFE | PTFE (2) |
| Example 10 | 0.000020 | 8 | PTFE | PTFE (2) |
| Example 11 | 0.000020 | 8 | PTFE | PTFE (2) |
| Example 12 | 0.000020 | 8 | PTFE | PTFE (2) |
| Example 13 | 0.000020 | 8 | PTFE | PP |
| Example 14 | 0.000020 | 8 | PTFE | SUS (1) |
| Example 15 | 0.000020 | 8 | PP | PTFE (2) |
| Example 16 | 0.000020 | 8 | SUS (1) | PTFE (2) |
| Example 17 | 0.000020 | 8 | PTFE | PTFE (2) |
| Example 18 | 0.000020 | 165 | PTFE | PTFE (2) |
| Example 19 | 0.000020 | 8 | SUS (2) | PTFE (2) |
| Example 20 | 0.000020 | 8 | PTFE (2) | PTFE (2) |
| Example 21 | 0.000020 | 8 | PTFE | PTFE (2) |
| Example 22 | 0.000007 | 7 | PTFE | PTFE (2) |
| Example 23 | 0.0020 | 7 | PTFE | PTFE (2) |
| Example 24 | 0.000020 | 8 | PTFE | PTFE (2) |
| Example 25 | 0.000020 | 8 | PTFE | PTFE (2) |
| Comparative Example 1 | 0.000020 | 256 | PTFE | PTFE (2) |
| Comparative Example 2 | 0.000020 | 7 | PTFE | PTFE (2) |
| Comparative Example 3 | 0.000020 | 7 | PTFE | PTFE (2) |
| Comparative Example 4 | 0.000020 | 7 | PTFE | PTFE (2) |
| Comparative Example 5 | 0.000020 | 8 | PTFE | PTFE (2) |

TABLE 5

| Table 1-5 | Evaluation | | |
|---|---|---|---|
| | Amount of metal impurity eluted | | Amount of organic impurity eluted |
| | From liquid contact portion of storage tank (based on mass) | From liquid contact portion of first connection member (based on mass) | From liquid contact portion of first connection member (based on mass) |
| Example 1 | <1 ppt | <1 ppt | <1 ppt |
| Example 2 | <1 ppt | <1 ppt | <1 ppt |
| Example 3 | <1 ppt | <1 ppt | <1 ppt |
| Example 4 | <1 ppt | <1 ppt | <1 ppt |
| Example 5 | <1 ppt | <1 ppt | <1 ppt |
| Example 6 | <1 ppt | <1 ppt | <1 ppt |
| Example 7 | <1 ppt | <1 ppt | <1 ppt |
| Example 8 | <1 ppt | <1 ppt | <1 ppt |
| Example 9 | <1 ppt | <1 ppt | <1 ppt |
| Example 10 | <1 ppt | <1 ppt | <1 ppt |
| Example 11 | <1 ppt | <1 ppt | <1 ppt |
| Example 12 | <1 ppt | <1 ppt | <1 ppt |
| Example 13 | <2 ppt | 1 ppb | 1 ppb |
| Example 14 | <1 ppt | 1 ppm | 1 ppm |
| Example 15 | 5 ppt | <1 ppt | <1 ppt |
| Example 16 | 1 ppm | <1 ppt | <1 ppt |
| Example 17 | <1 ppt | <1 ppt | <1 ppt |
| Example 18 | <1 ppt | <1 ppt | <1 ppt |
| Example 19 | <1 ppt | <1 ppt | <1 ppt |
| Example 20 | <1 ppt | <1 ppt | <1 ppt |
| Example 21 | <1 ppt | <1 ppt | <1 ppt |
| Example 22 | <1 ppt | <1 ppt | <1 ppt |

TABLE 5-continued

| Table 1-5 | Evaluation | | |
|---|---|---|---|
| | Amount of metal impurity eluted | | Amount of organic impurity eluted |
| | From liquid contact portion of storage tank (based on mass) | From liquid contact portion of first connection member (based on mass) | From liquid contact portion of first connection member (based on mass) |
| Example 23 | <1 ppt | <1 ppt | <1 ppt |
| Example 24 | <1 ppt | <1 ppt | <1 ppt |
| Example 25 | <1 ppt | <1 ppt | <1 ppt |
| Comparative Example 1 | <1 ppt | <1 ppt | <1 ppt |
| Comparative Example 2 | <1 ppt | <1 ppt | <1 ppt |
| Comparative Example 3 | <1 ppt | <1 ppt | <1 ppt |
| Comparative Example 4 | <1 ppt | <1 ppt | <1 ppt |
| Comparative Example 5 | <1 ppt | <1 ppt | <1 ppt |

TABLE 6

| Table 1-6 | Evaluation | | | | | |
|---|---|---|---|---|---|---|
| | Temporal change of content of metal impurity | | | Temporal stability of chemical liquid | Evaluation of chemical liquid as developer | |
| | After 100 days (Mass ppt) | After 200 days (Mass ppt) | After 300 days (Mass ppt) | After 300 days Change of component | Develop-ability | Defect inhibition performance |
| Example 1 | 18 | 18 | 18 | A | A | AA |
| Example 2 | 39 | 39 | 39 | A | A | A |
| Example 3 | 48 | 48 | 48 | A | A | B |
| Example 4 | 22 | 22 | 22 | A | A | A |
| Example 5 | 20 | 20 | 20 | A | A | C |
| Example 6 | 19 | 19 | 19 | A | A | B |
| Example 7 | 20 | 20 | 20 | A | A | B |
| Example 8 | 19 | 19 | 19 | A | A | AA |
| Example 9 | 23 | 23 | 23 | A | A | AA |
| Example 10 | 18 | 18 | 18 | A | A | AA |
| Example 11 | 26 | 63 | 100 | A | B | A |
| Example 12 | 65 | 158 | 562 | A | C | A |
| Example 13 | 25 | 63 | 100 | A | A | B |
| Example 14 | 65 | 158 | 562 | A | A | C |
| Example 15 | 20 | 30 | 55 | A | A | B |
| Example 16 | 36 | 86 | 123 | A | A | C |
| Example 17 | 25 | 25 | 25 | A | A | C |
| Example 18 | 23 | 23 | 23 | A | A | C |
| Example 19 | 20 | 20 | 20 | A | A | AA |
| Example 20 | 20 | 20 | 20 | A | A | AA |
| Example 21 | 22 | 22 | 22 | A | A | B |
| Example 22 | 22 | 22 | 22 | B | A | A |
| Example 23 | 22 | 22 | 22 | A | B | C |
| Example 24 | 18 | 18 | 18 | A | B | A |
| Example 25 | 26 | 26 | 26 | A | B | B |
| Comparative Example 1 | 662 | 680 | 697 | A | B | D |
| Comparative Example 2 | 20 | 22 | 23 | A | D | AA |
| Comparative Example 3 | 78 | 189 | 612 | A | C | D |
| Comparative Example 4 | 20 | 20 | 20 | A | B | D |
| Comparative Example 5 | 70 | 166 | 574 | A | D | D |

TABLE 7

| Table 2-1 | Organic solvent Type | Content (% by mass) | Organic impurity (Mass ppm) [A] | Alcohol impurity (mass ppm) [B] | [B]/[A] |
|---|---|---|---|---|---|
| Example 26 | PGMEA | Balance | 500 | 25 | 0.05 |
| Example 27 | PGMEA | Balance | 500 | 25 | 0.05 |
| Example 28 | PGMEA | Balance | 500 | 25 | 0.05 |
| Example 29 | PGMEA | Balance | 3000 | 25 | 0.01 |
| Example 30 | PGMEA | Balance | 8000 | 25 | 0.003 |
| Example 31 | PGMEA | Balance | 1000 | 25 | 0.03 |
| Example 32 | PGMEA | Balance | 1500 | 25 | 0.02 |
| Example 33 | EL | Balance | 500 | 30 | 0.06 |
| Example 34 | GBL | Balance | 500 | 20 | 0.04 |
| Example 35 | PGME | Balance | 500 | 20 | 0.04 |
| Example 36 | CyPe | Balance | 500 | 20 | 0.04 |
| Example 37 | CyHe | Balance | 500 | 20 | 0.04 |
| Example 38 | PGMEA | Balance | 500 | 100 | 0.2 |
| Example 39 | PGMEA | Balance | 500 | 200 | 0.4 |
| Example 40 | PGMEA | Balance | 500 | 25 | 0.05 |
| Example 41 | PGMEA | Balance | 500 | 25 | 0.05 |
| Example 42 | PGMEA | Balance | 500 | 25 | 0.05 |
| Example 43 | PGMEA | Balance | 500 | 25 | 0.05 |
| Example 44 | PGMEA | Balance | 500 | 25 | 0.05 |
| Example 45 | PGMEA | Balance | 500 | 25 | 0.05 |
| Example 46 | CHdMA | Balance | 500 | 25 | 0.05 |
| Example 47 | HBM | Balance | 500 | 25 | 0.05 |
| Example 48 | CyPe/PGMEA | 30/Balance | 500 | 25 | 0.05 |
| Example 49 | GBL/PGMEA | 30/Balance | 500 | 25 | 0.05 |
| Example 50 | nBA | Balance | 500 | 25 | 0.05 |
| Example 51 | nBA | Balance | 500 | 25 | 0.05 |
| Example 52 | nBA | Balance | 500 | 25 | 0.05 |
| Comparative Example 6 | PGMEA | Balance | 500 | 25 | 0.05 |
| Comparative Example 7 | PGMEA | Balance | 0.05 | 0.03 | 0.60 |
| Comparative Example 8 | PGMEA | Balance | 15000 | 1500 | 0.10 |
| Comparative Example 9 | PGMEA | Balance | 3000 | 0.1 | 0.00003 |
| Comparative Example 10 | PGMEA | Balance | 1500 | 1400 | 0.93 |

TABLE 8

| | Metal atoms contained in metal impurity | | | | | |
|---|---|---|---|---|---|---|
| | Fe | | Cr | | Ni | |
| Table 2-2 | Content (Mass ppt) | Mass ratio (Fe/total) | Content (Mass ppt) | Mass ratio (Cr/total) | Content (Mass ppt) | Mass ratio (Ni/total) |
| Example 26 | 2 | 0.12 | 1 | 0.06 | 2 | 0.12 |
| Example 27 | 10 | 0.27 | 3 | 0.08 | 9 | 0.24 |
| Example 28 | 14 | 0.30 | 4 | 0.09 | 14 | 0.30 |
| Example 29 | 2 | 0.10 | 1 | 0.05 | 3 | 0.14 |
| Example 30 | 2 | 0.11 | 1 | 0.05 | 3 | 0.16 |
| Example 31 | 3 | 0.17 | 1 | 0.06 | 3 | 0.17 |
| Example 32 | 3 | 0.17 | 1 | 0.06 | 4 | 0.22 |
| Example 33 | 3 | 0.16 | 1 | 0.05 | 2 | 0.11 |
| Example 34 | 3 | 0.14 | 1 | 0.05 | 3 | 0.14 |
| Example 35 | 2 | 0.12 | 1 | 0.06 | 3 | 0.18 |
| Example 36 | 2 | 0.11 | 2 | 0.11 | 3 | 0.16 |
| Example 37 | 8 | 0.28 | 2 | 0.07 | 4 | 0.14 |
| Example 38 | 2 | 0.12 | 1 | 0.06 | 3 | 0.18 |
| Example 39 | 8 | 0.28 | 2 | 0.07 | 4 | 0.14 |
| Example 40 | 2 | 0.11 | 1 | 0.06 | 4 | 0.22 |
| Example 41 | 3 | 0.14 | 1 | 0.05 | 3 | 0.14 |
| Example 42 | 2 | 0.09 | 1 | 0.04 | 4 | 0.17 |
| Example 43 | 2 | 0.11 | 1 | 0.05 | 3 | 0.16 |
| Example 44 | 2 | 0.11 | 1 | 0.05 | 2 | 0.11 |
| Example 45 | 2 | 0.11 | 1 | 0.06 | 2 | 0.11 |
| Example 46 | 10 | 0.28 | 3 | 0.08 | 9 | 0.25 |

TABLE 8-continued

| | Metal atoms contained in metal impurity | | | | | |
|---|---|---|---|---|---|---|
| | Fe | | Cr | | Ni | |
| Table 2-2 | Content (Mass ppt) | Mass ratio (Fe/total) | Content (Mass ppt) | Mass ratio (Cr/total) | Content (Mass ppt) | Mass ratio (Ni/total) |
| Example 47 | 10 | 0.26 | 3 | 0.08 | 9 | 0.23 |
| Example 48 | 10 | 0.28 | 3 | 0.08 | 9 | 0.25 |
| Example 49 | 10 | 0.25 | 3 | 0.08 | 9 | 0.23 |
| Example 50 | 3 | 0.15 | 1 | 0.05 | 4 | 0.20 |
| Example 51 | 2 | 0.10 | 1 | 0.05 | 3 | 0.14 |
| Example 52 | 2 | 0.10 | 1 | 0.05 | 3 | 0.14 |
| Comparative Example 6 | 153 | 0.26 | 112 | 0.19 | 145 | 0.25 |
| Comparative Example 7 | 2 | 0.13 | 1 | 0.06 | 2 | 0.13 |
| Comparative Example 8 | 3 | 0.16 | 1 | 0.05 | 2 | 0.11 |
| Comparative Example 9 | 2 | 0.11 | 1 | 0.05 | 3 | 0.16 |
| Comparative Example 10 | 2 | 0.11 | 1 | 0.06 | 3 | 0.17 |

TABLE 9

| | Metal atoms contained in metal impurity | | | | | Water |
|---|---|---|---|---|---|---|
| | Pb | | Others | | | |
| Table 2-3 | Content (Mass ppt) | Mass ratio (Pb/total) | Content (Mass ppt) | Mass ratio (Others/total) | Total (Mass ppt) | content (% By mass) |
| Example 26 | 1 | 0.06 | 11 | 0.65 | 17 | 0.10% |
| Example 27 | 3 | 0.08 | 12 | 0.32 | 37 | 0.10% |
| Example 28 | 3 | 0.06 | 12 | 0.26 | 47 | 0.10% |
| Example 29 | 1 | 0.05 | 14 | 0.67 | 21 | 0.10% |
| Example 30 | 1 | 0.05 | 12 | 0.63 | 19 | 0.10% |
| Example 31 | 1 | 0.06 | 10 | 0.56 | 18 | 0.10% |
| Example 32 | 1 | 0.06 | 9 | 0.50 | 18 | 0.10% |
| Example 33 | 1 | 0.05 | 12 | 0.63 | 19 | 0.10% |
| Example 34 | 1 | 0.05 | 13 | 0.62 | 21 | 0.10% |
| Example 35 | 1 | 0.06 | 10 | 0.59 | 17 | 0.10% |
| Example 36 | 1 | 0.05 | 11 | 0.58 | 19 | 0.10% |
| Example 37 | 3 | 0.10 | 12 | 0.41 | 29 | 0.10% |
| Example 38 | 1 | 0.06 | 10 | 0.59 | 17 | 0.10% |
| Example 39 | 3 | 0.10 | 12 | 0.41 | 29 | 0.10% |
| Example 40 | 1 | 0.06 | 10 | 0.56 | 18 | 0.10% |
| Example 41 | 1 | 0.05 | 13 | 0.62 | 21 | 0.10% |
| Example 42 | 1 | 0.04 | 15 | 0.65 | 23 | 0.10% |
| Example 43 | 1 | 0.05 | 12 | 0.63 | 19 | 0.10% |
| Example 44 | 1 | 0.05 | 13 | 0.68 | 19 | 1.50% |
| Example 45 | 1 | 0.06 | 12 | 0.67 | 18 | 0.10% |
| Example 46 | 3 | 0.08 | 11 | 0.31 | 36 | 0.10% |
| Example 47 | 3 | 0.08 | 14 | 0.36 | 39 | 0.10% |
| Example 48 | 3 | 0.08 | 11 | 0.31 | 36 | 0.10% |
| Example 49 | 3 | 0.08 | 15 | 0.38 | 40 | 0.10% |
| Example 50 | 1 | 0.05 | 11 | 0.55 | 20 | 0.07% |
| Example 51 | 1 | 0.05 | 14 | 0.67 | 21 | 0.10% |
| Example 52 | 1 | 0.05 | 14 | 0.67 | 21 | 0.10% |
| Comparative Example 6 | 106 | 0.18 | 68 | 0.12 | 584 | 0.10% |
| Comparative Example 7 | 1 | 0.06 | 10 | 0.63 | 16 | 0.10% |
| Comparative Example 8 | 1 | 0.05 | 12 | 0.63 | 19 | 0.10% |
| Comparative Example 9 | 1 | 0.05 | 12 | 0.63 | 19 | 0.10% |
| Comparative Example 10 | 1 | 0.06 | 11 | 0.61 | 18 | 0.10% |

TABLE 10

| Table 2-4 | Physical properties of chemical liquid | | Material of liquid contact portion | |
|---|---|---|---|---|
| | High-boiling-point compound/low-boiling-point compound | Number of coarse particles (number/ml) | Storage tank | First connection member |
| Example 26 | 0.000010 | 8 | PTFE | PTFE (2) |
| Example 27 | 0.000010 | 15 | PTFE | PTFE (2) |
| Example 28 | 0.000010 | 23 | PTFE | PTFE (2) |
| Example 29 | 0.000040 | 7 | PTFE | PTFE (2) |
| Example 30 | 0.000090 | 6 | PTFE | PTFE (2) |
| Example 31 | 0.000180 | 7 | PTFE | PTFE (2) |
| Example 32 | 0.001001 | 6 | PTFE | PTFE (2) |
| Example 33 | 0.000010 | 7 | PTFE | PTFE (2) |
| Example 34 | 0.000010 | 6 | PTFE | PTFE (2) |
| Example 35 | 0.000010 | 6 | PTFE | PTFE (2) |
| Example 36 | 0.000010 | 6 | PTFE | PTFE (2) |
| Example 37 | 0.000010 | 8 | PTFE | PTFE (2) |
| Example 38 | 0.000010 | 8 | PTFE | PP |
| Example 39 | 0.000010 | 8 | PTFE | SUS (1) |
| Example 40 | 0.000010 | 8 | PP | PTFE (2) |
| Example 41 | 0.000010 | 8 | SUS (1) | PTFE (2) |
| Example 42 | 0.000010 | 8 | SUS (1) | SUS (1) |
| Example 43 | 0.000010 | 8 | PTFE | PTFE (2) |
| Example 44 | 0.000010 | 8 | SUS (2) | PTFE (2) |
| Example 45 | 0.000010 | 165 | PTFE (2) | PTFE (2) |
| Example 46 | 0.000010 | 15 | SUS (2) | PTFE (2) |
| Example 47 | 0.000010 | 15 | PTFE (2) | PTFE (2) |
| Example 48 | 0.000010 | 15 | PTFE (2) | PTFE (2) |
| Example 49 | 0.000010 | 15 | PTFE | PTFE (2) |
| Example 50 | 0.000020 | 8 | PTFE | PTFE (2) |
| Example 51 | 0.000007 | 7 | PTFE | PTFE (2) |
| Example 52 | 0.0020 | 7 | PTFE | PTFE (2) |
| Comparative Example 6 | 0.000010 | 256 | PTFE | PTFE (2) |
| Comparative Example 7 | 0.000010 | 7 | PTFE | PTFE (2) |
| Comparative Example 8 | 0.000010 | 7 | PTFE | PTFE (2) |
| Comparative Example 9 | 0.000010 | 7 | PTFE | PTFE (2) |
| Comparative Example 10 | 0.000010 | 8 | PTFE | PTFE (2) |

TABLE 11

| Table 2-5 | Evaluation | | |
|---|---|---|---|
| | Amount of metal impurity eluted | | Amount of organic impurity eluted |
| | From liquid contact portion of storage tank (based on mass) | From liquid contact portion of first connection member (based on mass) | From liquid contact portion of first connection member (based on mass) |
| Example 26 | <1 ppt | <1 ppt | <1 ppt |
| Example 27 | <1 ppt | <1 ppt | <1 ppt |
| Example 28 | <1 ppt | <1 ppt | <1 ppt |
| Example 29 | <1 ppt | <1 ppt | <1 ppt |
| Example 30 | <1 ppt | <1 ppt | <1 ppt |
| Example 31 | <1 ppt | <1 ppt | <1 ppt |
| Example 32 | <1 ppt | <1 ppt | <1 ppt |
| Example 33 | <1 ppt | <1 ppt | <1 ppt |
| Example 34 | <1 ppt | <1 ppt | <1 ppt |
| Example 35 | <1 ppt | <1 ppt | <1 ppt |
| Example 36 | <1 ppt | <1 ppt | <1 ppt |
| Example 37 | <1 ppt | <1 ppt | <1 ppt |
| Example 38 | <2 ppt | 1 ppb | 1 ppb |
| Example 39 | <1 ppt | 1 ppm | 1 ppm |
| Example 40 | 5 ppt | <1 ppt | <1 ppt |
| Example 41 | 1 ppm | <1 ppt | <1 ppt |
| Example 42 | 5 ppm | 5 ppm | 5 ppm |
| Example 43 | 1 ppm | <1 ppt | <1 ppt |
| Example 44 | <1 ppt | <1 ppt | <1 ppt |

TABLE 11-continued

| Table 2-5 | Amount of metal impurity eluted | | Amount of organic impurity eluted |
|---|---|---|---|
| | From liquid contact portion of storage tank (based on mass) | From liquid contact portion of first connection member (based on mass) | From liquid contact portion of first connection member (based on mass) |
| Example 45 | <1 ppt | <1 ppt | <1 ppt |
| Example 46 | <1 ppt | <1 ppt | <1 ppt |
| Example 47 | <1 ppt | <1 ppt | <1 ppt |
| Example 48 | <1 ppt | <1 ppt | <1 ppt |
| Example 49 | <1 ppt | <1 ppt | <1 ppt |
| Example 50 | <1 ppt | <1 ppt | <1 ppt |
| Example 51 | <1 ppt | <1 ppt | <1 ppt |
| Example 52 | <1 ppt | <1 ppt | <1 ppt |
| Comparative Example 6 | <1 ppt | <1 ppt | <1 ppt |
| Comparative Example 7 | <1 ppt | <1 ppt | <1 ppt |
| Comparative Example 8 | <1 ppt | <1 ppt | <1 ppt |
| Comparative Example 9 | <1 ppt | <1 ppt | <1 ppt |
| Comparative Example 10 | <1 ppt | <1 ppt | <1 ppt |

TABLE 12

| Table 2-6 | Temporal change of content of metal impurity | | | Evaluation of chemical liquid as prewet solution | |
|---|---|---|---|---|---|
| | After 100 days (Mass ppt) | After 200 days (Mass ppt) | After 300 days (Mass ppt) | Develop-ability | Defect inhibition performance |
| Example 26 | 19 | 19 | 19 | A | AA |
| Example 27 | 40 | 40 | 40 | A | A |
| Example 28 | 53 | 53 | 53 | A | B |
| Example 29 | 24 | 24 | 24 | A | A |
| Example 30 | 22 | 22 | 22 | A | C |
| Example 31 | 20 | 20 | 20 | A | B |
| Example 32 | 20 | 20 | 20 | A | B |
| Example 33 | 21 | 21 | 21 | A | AA |
| Example 34 | 22 | 22 | 22 | A | AA |
| Example 35 | 19 | 19 | 19 | A | AA |
| Example 36 | 20 | 20 | 20 | A | AA |
| Example 37 | 30 | 30 | 30 | A | AA |
| Example 38 | 25 | 63 | 100 | B | A |
| Example 39 | 65 | 158 | 562 | C | A |
| Example 40 | 30 | 63 | 100 | A | B |
| Example 41 | 65 | 158 | 562 | A | C |
| Example 42 | 30 | 55 | 69 | A | B |
| Example 43 | 36 | 86 | 123 | A | C |
| Example 44 | 21 | 21 | 21 | A | C |
| Example 45 | 22 | 22 | 22 | A | C |
| Example 46 | 39 | 39 | 39 | A | A |
| Example 47 | 40 | 40 | 40 | A | A |
| Example 48 | 38 | 38 | 38 | A | A |
| Example 49 | 42 | 42 | 42 | A | A |
| Example 50 | 25 | 25 | 25 | A | B |
| Example 51 | 22 | 22 | 22 | A | A |
| Example 52 | 22 | 22 | 22 | B | C |
| Comparative Example 6 | 586 | 588 | 592 | B | D |
| Comparative Example 7 | 17 | 18 | 20 | D | AA |
| Comparative Example 8 | 80 | 198 | 622 | C | D |
| Comparative Example 9 | 20 | 20 | 20 | B | D |

TABLE 12-continued

| Table 2-6 | Temporal change of content of metal impurity ||| Evaluation of chemical liquid as prewet solution ||
|---|---|---|---|---|---|
| | After 100 days (Mass ppt) | After 200 days (Mass ppt) | After 300 days (Mass ppt) | Develop-ability | Defect inhibition performance |
| Comparative Example 10 | 72 | 168 | 580 | D | D |

As is evident from the results shown in Table 1 and Table 2, the chemical liquids according to the examples had the effects of the present invention. In contrast, the chemical liquids according to the comparative examples did not have the effects of the present invention.

Compared to the chemical liquids of Example 24 and Example 25, the chemical liquid described in Example 1, in which the metal impurity contained a Fe atom, a Ni atom, a Cr atom, and a Pb atom, the mass ratio of the content of the Fe atom to the total content of the metal atoms was 0.01 to 0.5, the mass ratio of the content of the Cr atom to the total content of the metal atoms was 0.01 to 0.5, the mass ratio of the content of the Ni atom to the total content of the metal atoms was 0.01 to 0.5, and the mass ratio of the content of the Pb atom to the total content of the metal atoms was 0.005 to 0.3, had further improved effects of the present invention.

The chemical liquid of Example 1, in which the mass ratio of the total content of the component having a boiling point equal to or higher than 250° C. to the total content of the component having a boiling point lower than 250° C. in the chemical liquid was 0.00001 to 0.001, had further improved defect inhibition performance compared to the chemical liquid of Example 23 (in which the mass ratio was greater than the upper limit) and the chemical liquid of Example 22 (in which the mass ratio was less than the lower limit). Furthermore, the chemical liquid of Example 1 had further improved temporal stability compared to the chemical liquid of Example 22.

The chemical liquid of Example 1, in which the content of water in the chemical liquid with respect to the total mass of the chemical liquid was 0.1% to 1.5% by mass, had further improved defect inhibition performance compared to the chemical liquid of Example 17 (in which the content of water was greater than the upper limit) and the chemical liquid of Example 21 (in which the content of water was less than the lower limit).

The chemical liquid of Example 1, in which the number of objects to be counted having a size equal to or greater than 0.1 µm that were counted by a light scattering-type liquid-borne particle counter was equal to or smaller than 100/mL, had further improved defect inhibition performance compared to the chemical liquid of Example 18.

The chemical liquid transfer method of Example 1, in which the liquid contact portion, contacting the chemical liquid, of at least one kind of constituent selected from the group consisting of the in-vehicle tank, the storage tank, and the first connection member was formed of a nonmetallic material or electropolished stainless steel, allowed the transferred chemical liquid to have further improved defect inhibition performance compared to the chemical liquid transfer methods of Example 14 and Example 16.

The chemical liquid of Example 19 was evaluated in terms of "Temporal change of total content of metal atoms in chemical liquid stored in storage tank" and "Temporal stability of chemical liquid stored in storage tank" under the condition in which the void volume of the storage tank was changed. All of the results from Examples 1 to 52 and Comparative Examples 1 to 10 were obtained by performing evaluation at a void volume of 15%. The void volume is determined by the following Equation (1).

Void volume={1−(volume of the chemical liquid in the storage tank/container volume of the storage tank)}×100    Equation (1)

TABLE 13

| Table 3 | Void volume (% By volume) | Temporal change of content of metal impurity ||| Temporal stability of chemical liquid |
|---|---|---|---|---|---|
| | | After 100 days (Mass ppt) | After 200 days (Mass ppt) | After 300 days (Mass ppt) | After 300 days Change of component |
| Example 19-1 | 0.01 | 20 | 36 | 72 | B |
| Example 19-2 | 0.1 | 20 | 32 | 50 | B |
| Example 19-3 | 0.5 | 20 | 24 | 27 | A |
| Example 19-4 | 1 | 20 | 21 | 21 | A |
| Example 19-5 | 10 | 20 | 20 | 20 | A |
| Example 19-6 | 20 | 20 | 21 | 21 | A |
| Example 19-7 | 30 | 20 | 23 | 30 | A |
| Example 19-8 | 40 | 20 | 25 | 34 | B |
| Example 19-9 | 50 | 20 | 26 | 38 | B |
| Example 19-10 | 0 | 20 | 41 | 85 | C |
| Example 19-11 | 55 | 20 | 48 | 92 | C |

Example 3-A

In the preparation of the chemical liquid of Example 3, the chemical liquid contact portions in the device and members used were repeatedly washed with the chemical liquid 1, and after it was confirmed that the content of the metal atoms contained in the metal impurity contained in the chemical liquid used for washing was less than 0.001 ppm, a chemical liquid was prepared. As a result, the content of the metal atoms contained in the metal impurity could be reduced by 20% compared to the chemical liquid of Example 3.

Example 3-B

In Example 3-A, the number of times of washing was reduced, and after it was confirmed that the content of the metal atoms contained in the metal impurity contained in the chemical liquid used for washing was less than 0.1 ppm, a chemical liquid was prepared. As a result, the same effects as those of Example 3-A were obtained.

Example 3-C

In Example 3-A, the number of times of washing was reduced, and after it was confirmed that the content of the metal atoms contained in the metal impurity contained in the chemical liquid used for washing was less than 10 ppm, a chemical liquid was prepared. As a result, the content of the metal atoms contained in the metal impurity could be reduced by 10% compared to the chemical liquid of Example 3.

Example 1-A

A chemical liquid was prepared and evaluated in the same manner as in Example 1, except that a mixed solvent of nBA and isoamyl acetate (7:3, mass ratio) was used instead of nBA. As a result, the same effects as those of Example 1 were obtained.

EXPLANATION OF REFERENCES

- 100: tank lorry
- 101: in-vehicle tank
- 102: storage tank
- 103: first connection member
- 104: valve
- 105: lorry joint nozzle
- 106: joint instrument
- 107: flange joint
- 108: valve
- 109: pipe line
- 200: manufacturing building
- 201: supply tank
- 202: pipe line
- 203: valve
- 204: pump
- 205: second connection member
- 206: device
- 207: pipe line
- 208: valve
- 209: pump
- 210: third connection member
- 211: filter

What is claimed is:

1. A chemical liquid storage body comprising:
a storage tank; and
the chemical liquid that is stored in the storage tank,
wherein the chemical liquid comprises:
an organic solvent;
a metal impurity; and
an organic impurity,
wherein the metal impurity contains metal atoms,
a total content of the metal atoms in the chemical liquid with respect to a total mass of the chemical liquid is equal to or smaller than 50 mass ppt,
a total content of the organic impurity in the chemical liquid with respect to the total mass of the chemical liquid is 0.1 to 10,000 mass ppm,
the organic impurity contains an alcohol impurity,
a mass ratio of a content of the alcohol impurity to the total content of the organic impurity is 0.0001 to 0.5, and
a ratio of a headspace portion in the storage tank to the internal volume of the storage tank is 0.5% to 30% by volume.

2. The chemical liquid storage body according to claim 1, wherein the metal impurity contains a Fe atom, a Ni atom, a Cr atom, and a Pb atom,
a mass ratio of a content of the Fe atom to the total content of the metal atoms is 0.01 to 0.5,
a mass ratio of a content of the Cr atom to the total content of the metal atoms is 0.01 to 0.5,
a mass ratio of a content of the Ni atom to the total content of the metal atoms is 0.01 to 0.5, and
a mass ratio of a content of the Pb atom to the total content of the metal atoms is 0.005 to 0.3.

3. The chemical liquid storage body according to claim 1, wherein a mass ratio of a total content of a component having a boiling point equal to or higher than 250° C. to a total content of a component having a boiling point lower than 250° C. in the chemical liquid is 0.00001 to 0.001.

4. The chemical liquid storage body according to claim 1, wherein a content of water in the chemical liquid with respect to the total mass of the chemical liquid is 0.1% to 1.5% by mass.

5. The chemical liquid storage body according to claim 1, wherein the number of objects to be counted having a size equal to or greater than 0.1 µm that are counted by a light scattering liquid-borne particle counter is equal to or smaller than 100/mL.

6. The chemical liquid storage body according to claim 1, wherein the organic solvent has a boiling point lower than 200° C.

7. The chemical liquid storage body according to claim 1, wherein the organic solvent contains at least one compound selected from the group consisting of propylene glycol monomethyl ether, propylene glycol monoethyl ether, propylene glycol monopropyl ether, propylene glycol monomethyl ether acetate, ethyl lactate, methyl methoxypropionate, hexyl alcohol, 2-heptanone, isoamyl acetate, cyclopentanone, cyclohexanone, γ-butyrolactone, diisoamyl ether, butyl acetate, 2-hydroxymethyl butyrate, cyclohexanone dimethyl acetal, and 4-methyl-2-pentanol.

8. A chemical liquid storage body according to claim 1, wherein a liquid contact portion contacting the chemical liquid in the storage tank is formed of a nonmetallic material or electropolished stainless steel.

9. The chemical liquid storage body according to claim 8, wherein the nonmetallic material is at least one material selected from the group consisting of a polyethylene resin, a polypropylene resin, a polyethylene-polypropylene resin, polytetrafluoroethylene, a tetrafluoroethylene-perfluoroalkyl vinyl ether copolymer, a tetrafluoroethylene-hexafluoropropylene copolymer resin, a tetrafluoroethylene-ethylene copolymer resin, a chlorotrifluoro ethylene-ethylene copolymer resin, a vinylidene fluoride resin, a chlorotrifluoroethylene copolymer resin, and a vinyl fluoride resin.

* * * * *